(12) United States Patent
Oike et al.

(10) Patent No.: US 11,818,890 B2
(45) Date of Patent: *Nov. 14, 2023

(54) SEMICONDUCTOR MEMORY DEVICE

(71) Applicant: KIOXIA CORPORATION, Tokyo (JP)

(72) Inventors: Go Oike, Mie (JP); Tsuyoshi Sugisaki, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/665,979

(22) Filed: Feb. 7, 2022

(65) Prior Publication Data

US 2022/0157851 A1    May 19, 2022

Related U.S. Application Data

(63) Continuation of application No. 17/087,724, filed on Nov. 3, 2020, now Pat. No. 11,282,858, which is a
(Continued)

(30) Foreign Application Priority Data

Mar. 14, 2018   (JP) .................................. 2018-046940

(51) Int. Cl.
*H10B 43/27*      (2023.01)
*G11C 5/06*       (2006.01)
(Continued)

(52) U.S. Cl.
CPC ............. *H10B 43/27* (2023.02); *G11C 5/063* (2013.01); *G11C 16/0483* (2013.01);
(Continued)

(58) Field of Classification Search
CPC ........ H10B 43/27; H10B 41/27; H10B 43/10; H10B 43/35; H10B 43/50; H10B 41/35;
(Continued)

(56) References Cited

U.S. PATENT DOCUMENTS 8,957,471 B2   2/2015  Fukuzumi
8,969,945 B2   3/2015  Kito et al.
(Continued)

FOREIGN PATENT DOCUMENTS

CN    104662660 A    5/2015
JP    2008-258458    10/2008
(Continued)

*Primary Examiner* — Thong Q Le
(74) *Attorney, Agent, or Firm* — Oblon, McClelland, Maier & Neustadt, L.L.P.

(57) ABSTRACT

According to one embodiment, a semiconductor memory device includes a plurality of first interconnect layers, first and second memory pillars, and a plurality of first plugs. The plurality of first interconnect layers include a first array region where the first memory pillar penetrates the plurality of first interconnect layers, a second array region where the second memory pillar penetrates the plurality of first interconnect layers, and a coupling region where a plurality of coupling parts respectively coupled to the plurality of first plugs are formed. Along a first direction parallel to the semiconductor substrate, the first array region, the coupling region, and the second array region are arranged in order.

12 Claims, 31 Drawing Sheets

Related U.S. Application Data continuation of application No. 16/751,293, filed on Jan. 24, 2020, now Pat. No. 10,861,875, which is a continuation of application No. 16/118,598, filed on Aug. 31, 2018, now Pat. No. 10,763,277.

(51) Int. Cl.

| | | |
|---|---|---|
| *G11C 16/04* | (2006.01) | |
| *G11C 16/08* | (2006.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/35* | (2023.01) | |
| *H01L 29/792* | (2006.01) | |

(52) U.S. Cl.
CPC ............. *G11C 16/08* (2013.01); *H10B 41/10* (2023.02); *H10B 41/27* (2023.02); *H10B 41/35* (2023.02); *H10B 43/10* (2023.02); *H10B 43/35* (2023.02); *H01L 29/792* (2013.01)

(58) Field of Classification Search
CPC ........ H10B 41/10; H10B 43/40; H10B 43/20; H10B 41/41; H10B 41/50; H10B 43/00; H10B 41/20; H10B 69/00; H10B 41/40; H10B 99/00; G11C 16/0483; G11C 16/08; G11C 5/063; G11C 16/24; G11C 5/025; G11C 16/10; G11C 16/26; G11C 16/16; G11C 8/14; G11C 16/30; G11C 5/02; G11C 5/06; G11C 11/5628; G11C 7/02; G11C 11/40; G11C 11/4085; G11C 11/5671; G11C 16/0408; G11C 16/0466; G11C 16/14; G11C 8/12; G11C 16/0433; G11C 16/32; G11C 16/3436; G11C 16/3445; G11C 16/3459; G11C 16/3486; G11C 7/06; G11C 8/10; G11C 11/4023; G11C 7/12; G11C 8/08; H01L 29/792; H01L 29/7926; H01L 29/42348; H01L 23/528; H01L 23/481; H01L 23/5226; H01L 2224/80895; H01L 2224/80896; H01L 29/40114; H01L 29/42384; H01L 29/66757; H01L 29/78642; H01L 23/5283; H01L 29/1037; H01L 29/0688; H01L 21/02164; H01L 21/02532; H01L 21/02592; H01L 21/02595; H01L 21/0262; H01L 21/02667; H01L 21/31116; H01L 21/823487; H01L 29/40117; H01L 29/04
USPC ............ 365/185.17, 185.18, 185.29, 185.11, 365/185.33, 51, 63, 184; 257/324, 326, 257/306, 316, 390, E27.102, E29.309
See application file for complete search history.

(56) References Cited

U.S. PATENT DOCUMENTS

| | | |
|---|---|---|
| 9,953,992 B1 | 4/2018 | Ogawa et al. |
| 10,283,709 B2 | 5/2019 | Ko |
| 11,282,858 B2 * | 3/2022 | Oike ..................... H10B 43/27 |
| 2009/0267128 A1 | 10/2009 | Maejima |
| 2009/0268522 A1 | 10/2009 | Maejima |
| 2010/0052042 A1 | 3/2010 | Tanaka et al. |
| 2010/0207195 A1 | 8/2010 | Fukuzumi et al. |
| 2011/0284946 A1 | 11/2011 | Kiyotoshi |
| 2014/0027838 A1 | 1/2014 | Kido et al. |
| 2014/0061747 A1 | 3/2014 | Tanzawa et al. |
| 2017/0069656 A1 | 3/2017 | Minami |
| 2017/0236779 A1 | 8/2017 | Komori |
| 2017/0256551 A1 | 9/2017 | Lee |
| 2017/0294383 A1 | 10/2017 | Tanzawa |
| 2018/0145029 A1 | 5/2018 | Tanzawa |
| 2018/0350825 A1 | 12/2018 | Ogawa et al. |
| 2019/0139977 A1 | 5/2019 | Lee |
| 2019/0139978 A1 | 5/2019 | Kim et al. |

FOREIGN PATENT DOCUMENTS

| | | |
|---|---|---|
| JP | 2014-27104 A | 2/2014 |
| JP | 2015-52691 A | 9/2015 |
| JP | 2018-26518 A | 2/2018 |

* cited by examiner

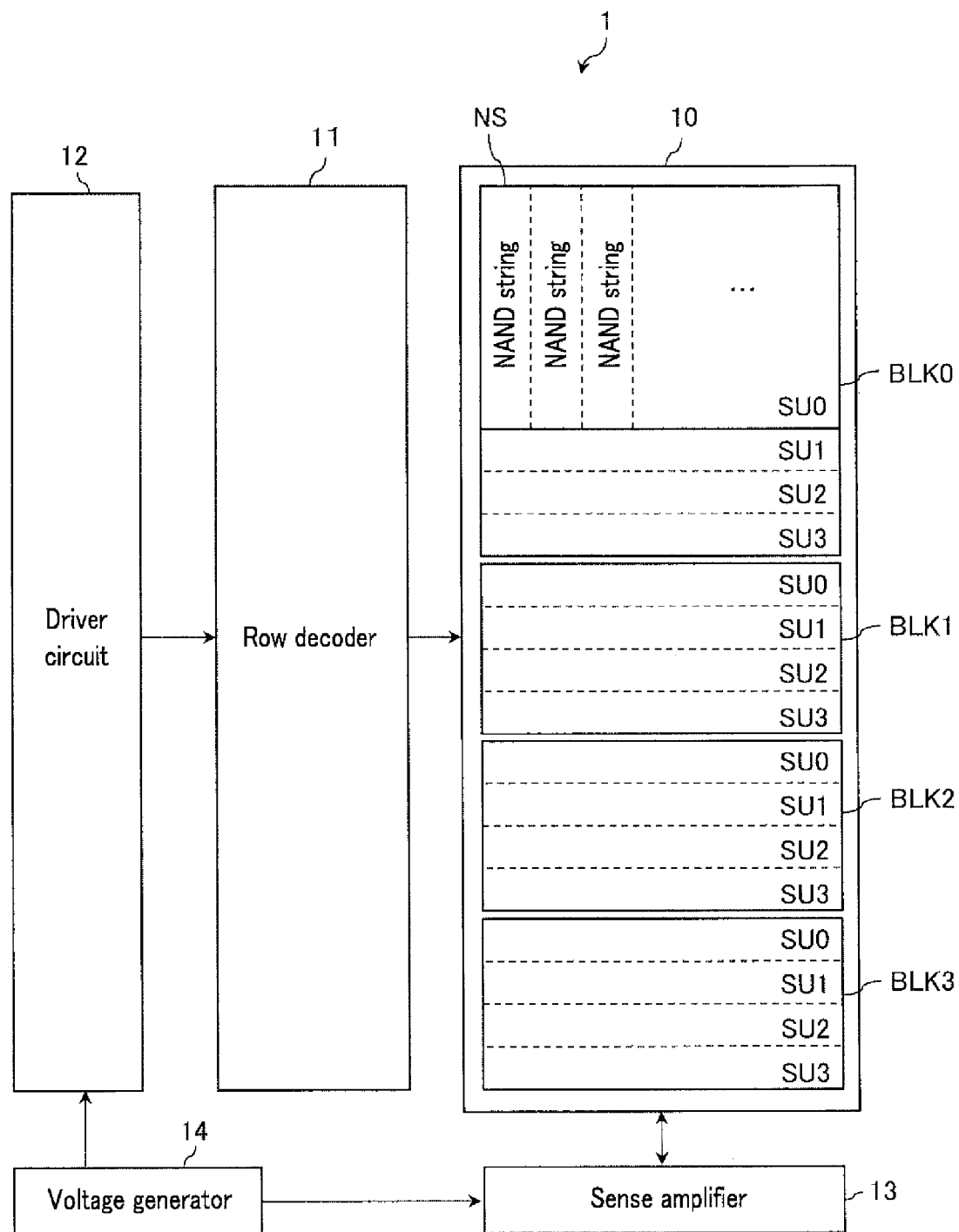
F I G. 1

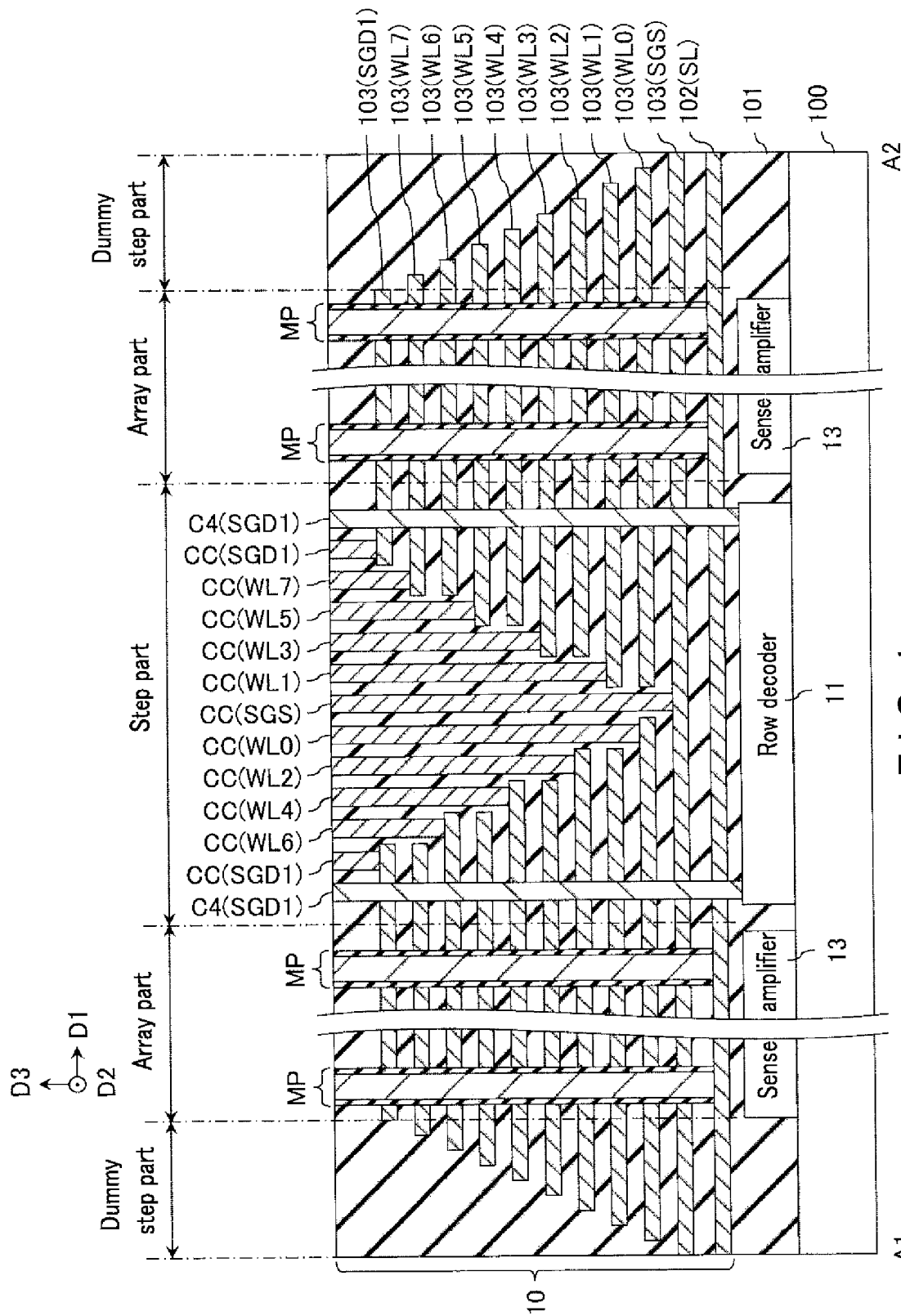
F I G. 4

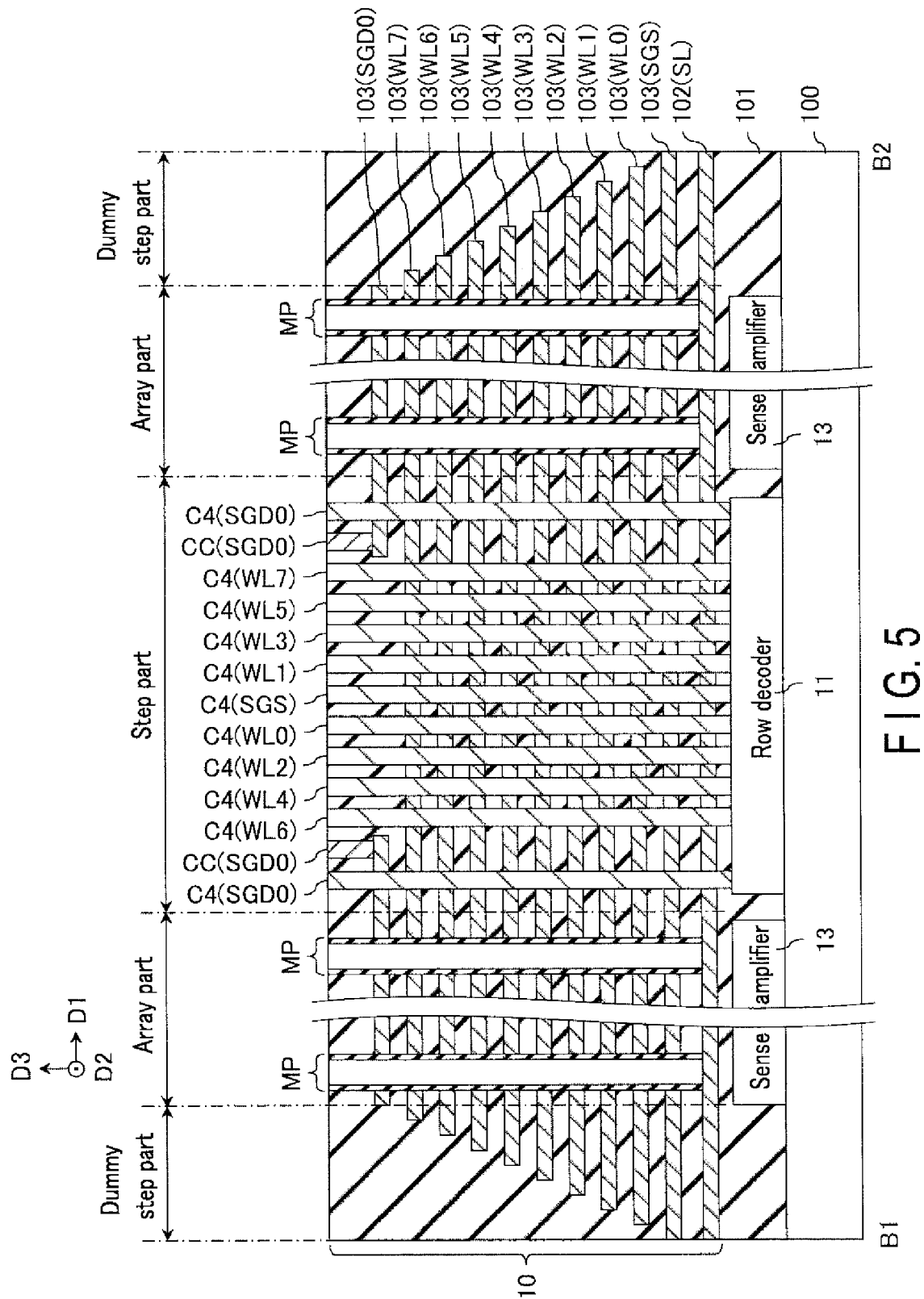
F I G. 5

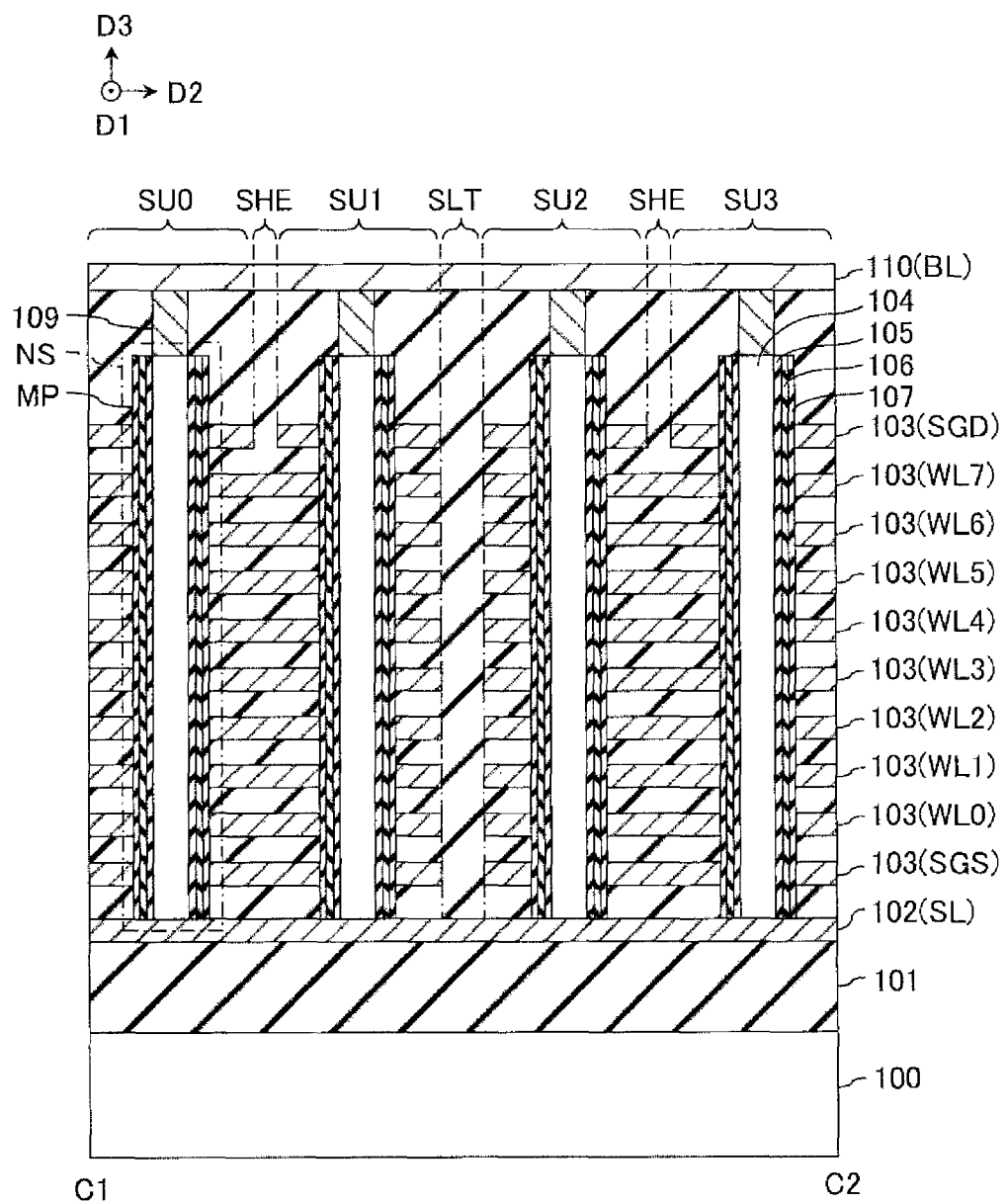
F I G. 6

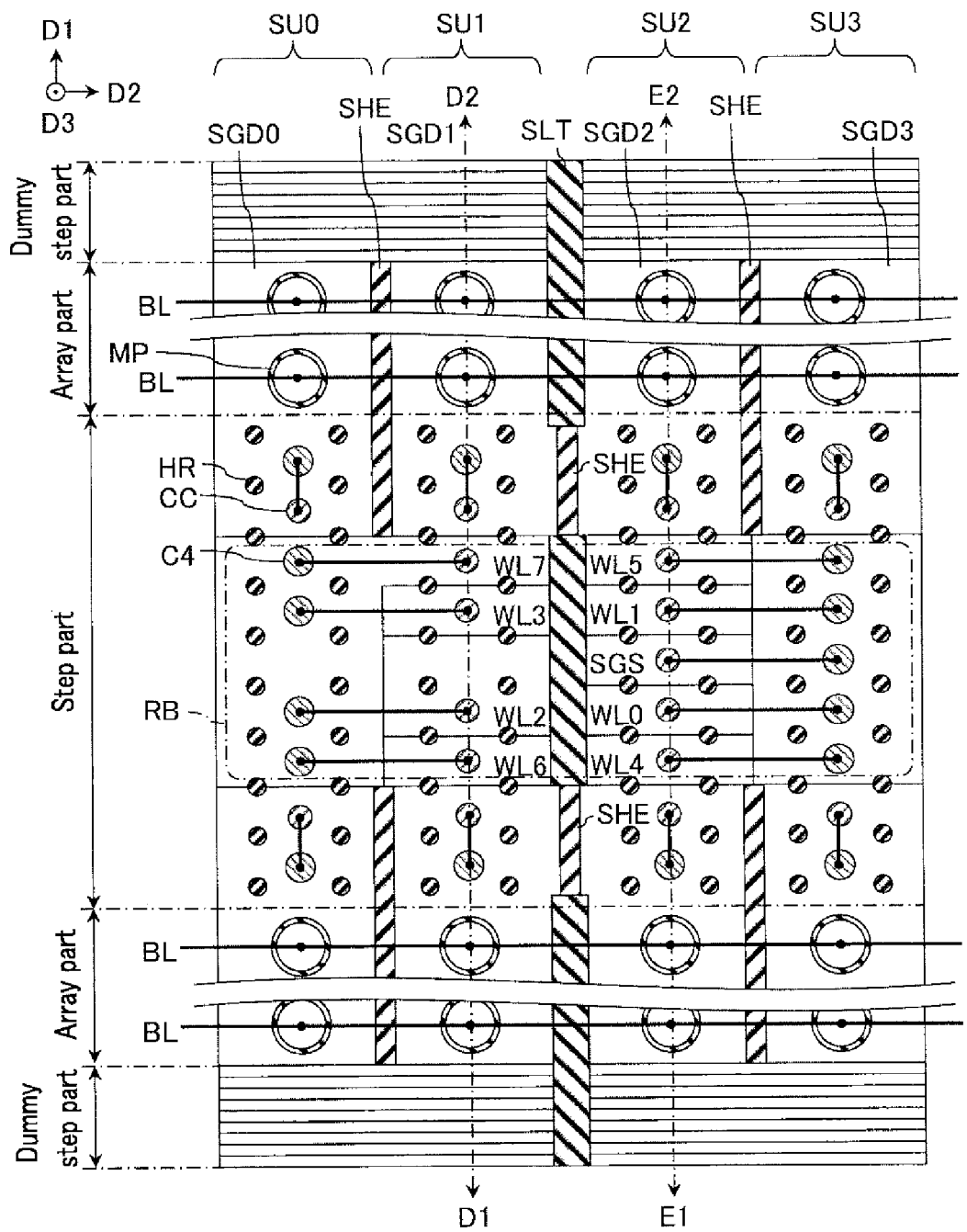
F I G. 20

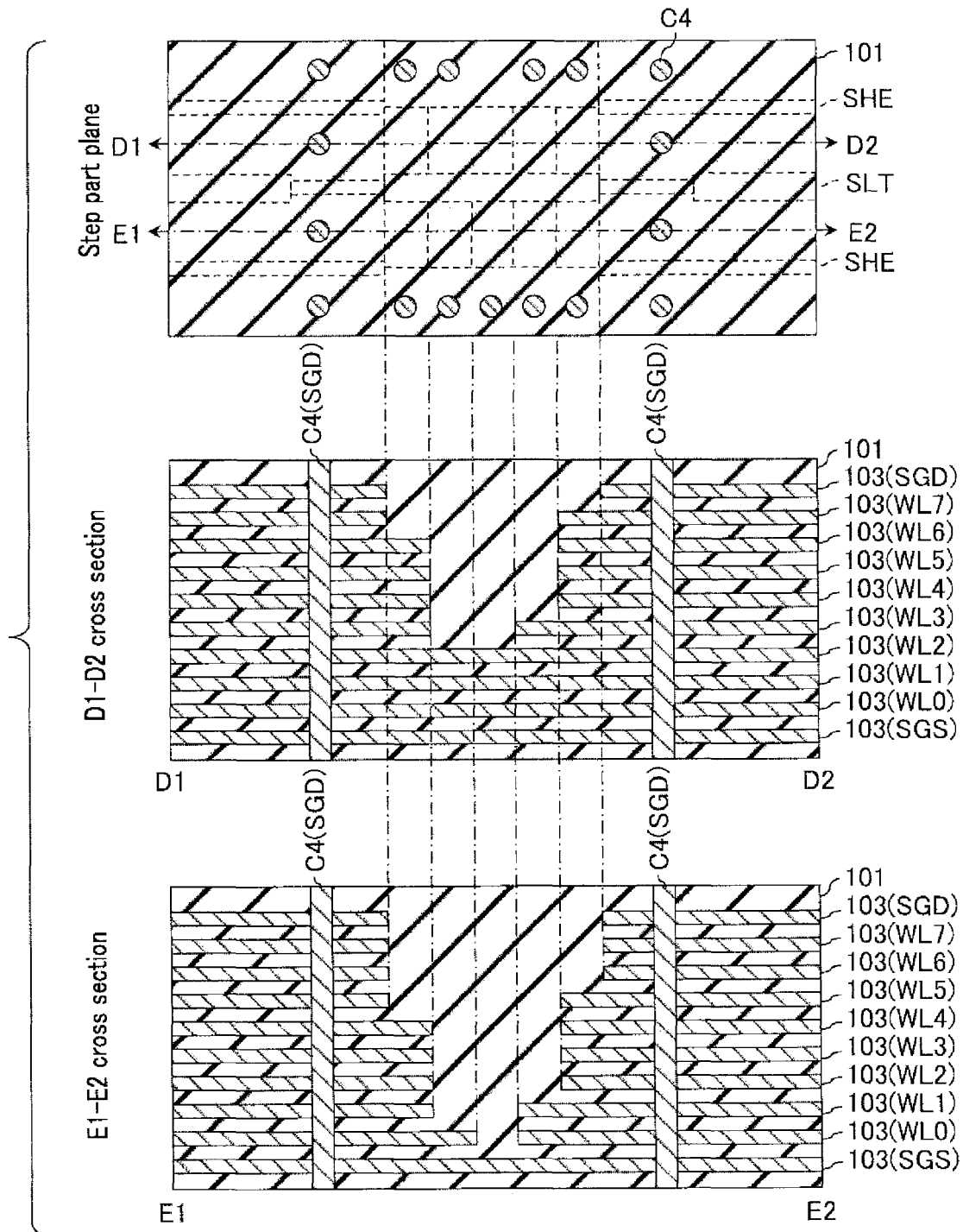
F I G. 30

SEMICONDUCTOR MEMORY DEVICE

CROSS-REFERENCE TO RELATED APPLICATIONS

This application is a continuation of U.S. application Ser. No. 17/087,724 filed Nov. 3, 2020, which is a continuation of U.S. application Ser. No. 16/751,293 filed Jan. 24, 2020 which is a continuation of U.S. application Ser. No. 16/118,598 filed Aug. 31, 2018, and is based upon and claims the benefit of priority from Japanese Patent Application No. 2018-046940, filed Mar. 14, 2018, the entire contents of each of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 1 is a block diagram of a semiconductor memory device according to a first embodiment;

FIG. 4 is a cross-sectional view taken along a line A1-A2 in FIG. 3;

FIG. 5 is a cross-sectional view taken along a line B1-B2 in FIG. 3;

FIG. 6 is a cross-sectional view taken along a line C1-C2 in FIG. 3;

FIG. 20 is a plan view of a memory cell array in a semiconductor memory device according to a second embodiment; and FIGS. 21-31 are diagrams illustrating a manufacturing process of a step part of the memory cell array in the semiconductor memory device according to the second embodiment.

DETAILED DESCRIPTION

Figure 2:
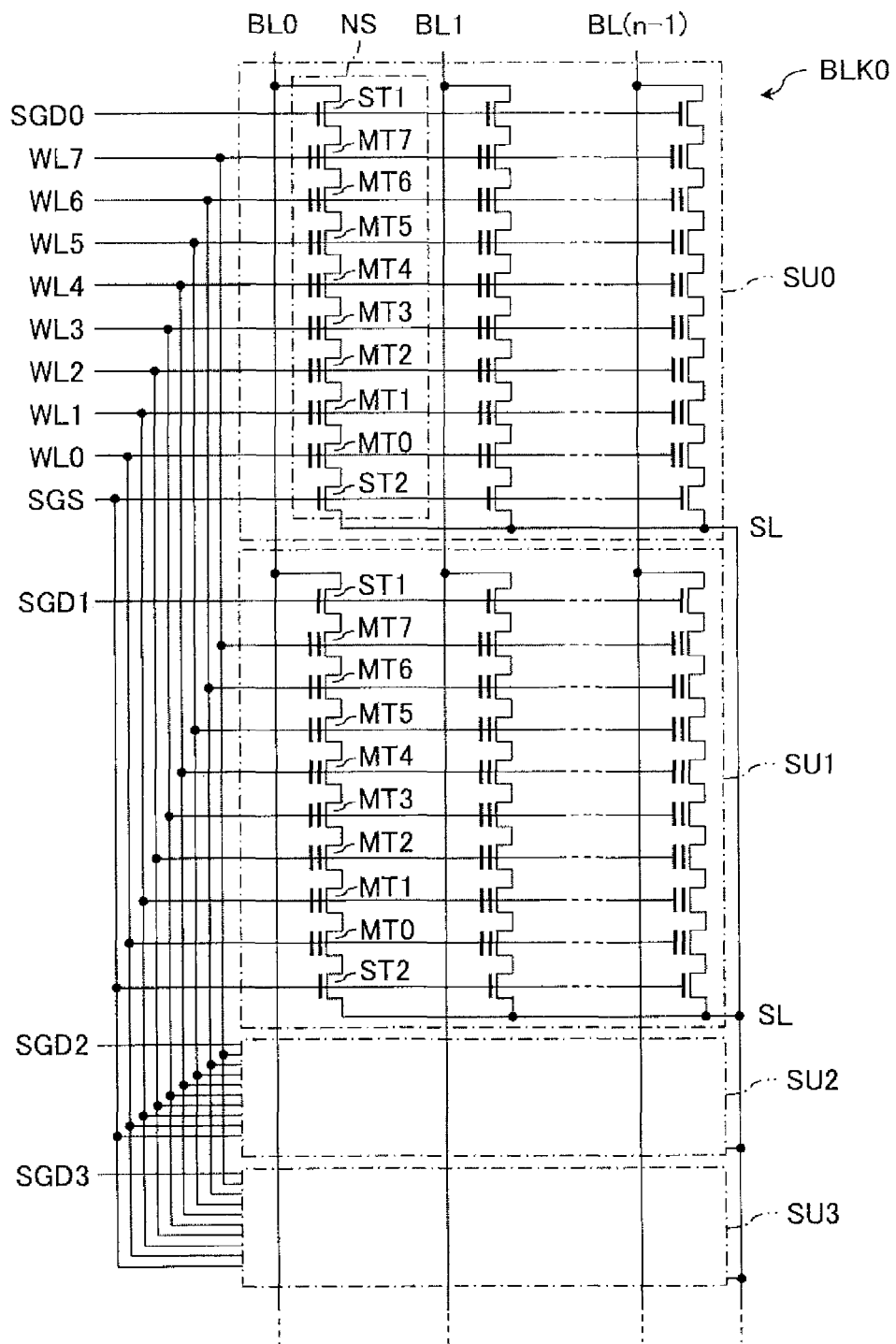
FIG. 2 is a circuit diagram of a memory cell array in the semiconductor memory device according to the first embodiment.

In general, according to one embodiment, a semiconductor memory device includes: a plurality of first interconnect layers stacked above a semiconductor substrate with first insulating layers interposed therebetween, first and second memory pillars penetrating the plurality of first interconnect layers, and a plurality of first plugs, bottom surfaces of which are in respective contact with the plurality of first interconnect layers. The plurality of first interconnect layers include a first array region where the first memory pillar penetrates the plurality of first interconnect layers, a second array region where the second memory pillar penetrates the plurality of first interconnect layers, and a coupling region where a plurality of coupling parts respectively coupled to the plurality of first plugs are formed. The first array region, the coupling region, and the second array region are arranged in order along a first direction parallel to the semiconductor substrate.

1. First Embodiment

Here, a semiconductor memory device according to a first embodiment will be described. In the following descriptions, as a semiconductor memory device, a three-dimensional stacked NAND flash memory in which memory cell transistors are stacked three-dimensionally on the semiconductor substrate will be described by way of example.

1.1 Configuration 1.1.1 General Configuration of the Semiconductor Memory Device First, a general configuration of a semiconductor memory device will be described using FIG. 1. FIG. 1 is an example of a block diagram illustrating a basic general configuration of a semiconductor memory device. In the example of FIG. 1, a part of the coupling of each block is indicated by an arrow line. However, coupling between the blocks is not limited to this.

As shown in FIG. 1, a NAND flash memory 1 includes a memory cell array 10, a row decoder 11, a driver circuit 12, a sense amplifier 13, and a voltage generator 14.

The memory cell array 10 includes a plurality (in the present embodiment, four) of blocks BLK (BLK0 to BLK3) which are aggregates of non-volatile memory cell transistors. Each of the blocks BLK includes a plurality (in the present embodiment, four) of string units SU (SU0 to SU3) that are an aggregate of NAND strings NS in which the memory cell transistors are coupled in series. The number of blocks BLK in the memory cell array 10 and the number of string units SU in the block BLK are discretionary.

The row decoder 11 includes a block decoder and a hookup circuit which are not depicted in the drawings. The block decoder decodes a row address, and selects a row direction of a corresponding block BLK based on the decoding result. The row decoder 11 is coupled to word lines and select gate lines of each block BLK via the hookup circuit.

The driver circuit 12 supplies voltage necessary for a write operation, a read operation, and an erase operation of data to the row decoder 11. This voltage is applied to corresponding word lines and select gate lines via the row decoder 11.

The sense amplifier 13 senses data which has been read from the memory cell transistor during a data read operation. In addition, during a data write operation, the written data is transferred to the memory cell transistor.

The voltage generator 14 generates voltage necessary for the data write, read, and erase operations, and supplies it to the driver circuit 12, the sense amplifier 13, etc.

1.1.2 Configuration of the Memory Cell Array

Next, a configuration of the memory cell array 10 will be described using FIG. 2. An example of FIG. 2 illustrates a block BLK0, however the other blocks BLK also have the same configuration.

As shown in FIG. 2, the block BLK0 includes, for example, four string units, SU0 to SU3. Each string unit SU includes a plurality of NAND strings NS. Each of the NAND strings NS includes, for example, eight memory cell transistors MT (MT0 to MT7) and select transistors ST1 and ST2. The memory cell transistor MT comprises a control gate and a charge storage layer, and stores data in a non-volatile manner.

It should be noted that the memory cell transistors MT may be of a MONOS type in which an insulating film is used as the charge storage layer, or an FG type in which a conductive film is used as the charge storage layer. In the present embodiment, a MONOS type will be explained by way of example. In addition, the number of the memory cell transistors MT is not limited to 8, and may be, for example, 16, 32, 64, 96, and 128. The number of the memory cell transistors MT is not limited. Moreover, the number of the select transistors ST1 and ST2 is discretionary, and each may be a number greater than one.

The eight memory cell transistors MT are coupled in series between a source of the select transistor ST1 and a drain of the select transistor ST2. More specifically, current paths of the memory cell transistors MT0 to MT7 are coupled in series. Subsequently, a drain of the memory cell transistor MT7 is coupled to a source of the select transistor ST1, and a source of the memory cell transistor MT0 is coupled to a drain of the select transistor ST2.

A gate of the select transistor ST1 in each of the string units SU0 to SU3 is coupled to different select gate lines SGD0 to SGD3, respectively, for every string unit SU. A more specific example might see gates of a plurality of select transistors ST1 in the string SU0 commonly coupled to a select gate line SGD0.

The gates of the select transistors ST2 in the string units SU0 to SU3 are commonly coupled to the select gate line SGS. Namely, the gates of a plurality of select transistors ST2 in the same block BLK are commonly coupled to the select gate line SGS. It should be noted that a gate of the select transistor ST2 in each of the string units SU0 to SU3 may be coupled to different select gate lines SGS0 to SGS3, respectively, for every string unit SU.

Control gates of the memory cell transistors MT0 to MT7 in the same block BLK are commonly coupled to the word lines WL0 to WL7, respectively. More specifically, for example, control gates of a plurality of memory cell transistors MT0 in the block BLK0 are commonly coupled to a word line WL0.

Drains of a plurality of select transistors ST1 in a string unit SU are respectively coupled to different bit lines BL (BL0 to BL(n−1), where "n" is a natural number of 2 or more). Namely, a plurality of NAND strings NS in a string unit SU are respectively coupled to different bit lines BL. In addition, a bit line BL commonly couples one NAND string NS included in each of the string units SU0 to SU3 in each block BLK.

Sources of the select transistors ST2 in a plurality of blocks BLK are commonly coupled to a source line SL.

Namely, a string unit SU is an aggregate of the NAND strings NS, each of which is coupled to a different bit line BL and is coupled to the same select gate line SGD. In addition, a block BLK is an aggregate of a plurality of string units SU sharing the word lines WL. The memory cell array 10 is an aggregate of a plurality of blocks BLK which share the bit lines BL.

It should be noted that the memory cell array 10 may be configured in a different manner. That is, the configuration of the memory cell array 10 is described, for example, in U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 10 is also described in U.S. patent application Ser. No. 12/406,524 entitled "THREE DIMENSIONAL STACKED NON-VOLATILE SEMICONDUCTOR MEMORY" filed on Mar. 18, 2009; U.S. patent application Ser. No. 12/679,991 entitled "NON-VOLATILE SEMICONDUCTOR STORAGE DEVICE AND METHOD OF MANUFACTURING THE SAME" filed on Mar. 25, 2010; and U.S. patent application Ser. No. 12/532,030 entitled "SEMICONDUCTOR MEMORY AND METHOD FOR MANUFACTURING SAME" filed on Mar. 23, 2009. The entire contents of these applications are incorporated herein by reference.

1.1.3 Plane Configuration of the Memory Cell Array

Figure 3:
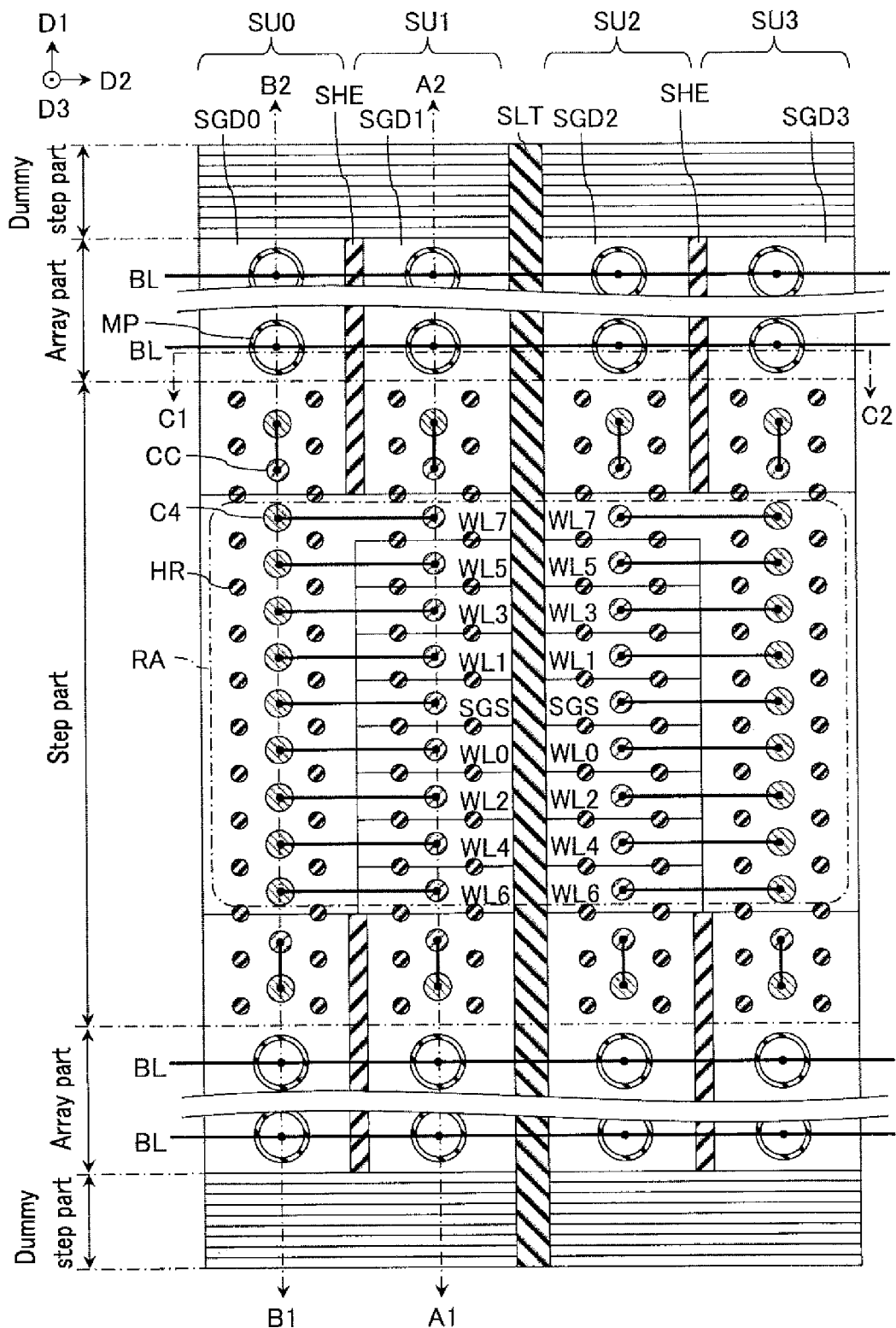
FIG. 3 is a plan view of the memory cell array in the semiconductor memory device according to the first embodiment.

Next, a plane configuration of the memory cell array 10 will be described using FIG. 3. FIG. 3 is a plan view of string units SU0 to SU4 in one block BLK. It should be noted that in an example of FIG. 3, an inter-layer insulating film is omitted.

As shown in FIG. 3, in the memory cell array 10 in the present embodiment, the word lines WL and the select gate line SGS are shared in the string units SU0 and SU1. Subsequently, a slit SHE is formed between the select gate line SGD0 of the string unit SU0 and the select gate line SGD1 of the string unit SU1 so that the select gate lines SGD0 and SGD1 are separated. The same applies to the string units SU2 and SU3. A slit SLT is formed between the string units SU1 and SU2 so that respective select gate lines SGD and SGS and word lines WL are separated.

The memory cell array 10 comprises two array parts, a step part, and two dummy step parts. More specifically, along a first direction D1 parallel to the semiconductor substrate, from one end of the memory cell array 10 to the other, the dummy step part, the array part, the step part, the array part, and the dummy step part are arranged in order, and the step part is arranged in the center of the memory cell array 10. Namely, the word line WL has regions corresponding to two array parts, a step part, and two dummy step parts along the first direction D1, and the step part is provided between the two array parts.

In the array part, a memory pillar MP corresponding to a NAND string NS is formed. Details of a configuration of the memory pillar MP will be described later. In the example of FIG. 3, in each string unit SU, a plurality of memory pillars MP are arranged in a row along the first direction D1. For example, an upper end of the memory pillar MP of each string unit SU, arranged along a second direction parallel to the semiconductor substrate and at a right angle to the first direction D1, is commonly coupled by a bit line BL.

The select gate lines SGD0 to SGD3 corresponding to the two array parts are respectively separated in the step part. Thus, in one string unit SU, either one of the two array parts is chosen by selecting either one of the separated select gate lines SGD.

It should be noted that an arrangement of the memory pillars MP in one string unit SU can be discretionarily set. For example, along the first direction D1, the memory pillars MP may be arranged in two parallel rows, or in a four-line staggered layout.

In the step part, a plurality of interconnect layers corresponding to the select gate lines SGD and SGS and the word lines WL0 to WL7 are led stepwise (hereinafter, a lead-out portion will be referred to as "terrace."). Namely, terraces of the word lines WL0 to WL7 are formed in the center of the interconnect layers corresponding to the word lines WL0 to WL7 in the first direction D1. A contact plug CC is formed on each terrace. In the step part, to couple the row decoder 11 (a hookup circuit) formed in a lower layer of the memory cell array 10 to the contact plugs CC, contact plugs C4 which penetrate the memory cell array 10 are formed. Upper ends of the contact plugs CC and contact plugs C4 are coupled by an interconnect layer. The contact plugs CC and C4 are made from conductive materials. For example, metal materials, such as tungsten (W) and nitride titanium (TiN), etc., may be used. An insulating layer (e.g., a silicon oxide film-not depicted in the drawings) is formed on a side surface of the contact plug C4, and the contact plug C4 is not electrically coupled to the select gate line SGS, the word lines WL0 to WL7, and the select gate line SGD.

The select gate line SGD of each string unit SU is separated into two in the step part of the first direction D1, and the contact plugs CC and C4 corresponding to each separated select gate line SGD are respectively arranged along the first direction D1.

In the step part of the string unit SU0, a terrace of the word line WL7 is arranged between the two select gate lines SGD0. Subsequently, to penetrate this terrace, the contact plugs C4 corresponding to the word lines WL6, WL4, WL2, and WL0, the select gate line SGS, and the word lines WL1, WL3, WL5, and WL7 are arranged in order along the first direction D1.

In the step part of the string unit SU1, terraces of the word lines WL6, WL4, WL2, and WL0, the select gate line SGS, and the word lines WL1, WL3, WL5, and WL7 are arranged in order along the first direction D1 between the two select gate lines SGD1. Namely, the terraces of the word lines WL0 to WL7 corresponding to the string units SU0 and SU1 are arranged in a row along the first direction D1. Subsequently, a contact plug CC is arranged on each terrace. That is, the contact plugs CC corresponding to the word lines WL6, WL4, WL2, and WL0, the select gate line SGS, and the word lines WL1, WL3, WL5, and WL7 are arranged in order along the first direction D1.

In the step parts of the string units SU2 and SU3, terraces and contact plugs CC and C4 are arranged so as to be symmetrical with the step parts of the string units SU0 and SU1, with a slit SLT interposed therebetween.

More specifically, in the step part of the string unit SU2, the terraces of the word lines WL6, WL4, WL2, and WL0, the select gate line SGS, and the word lines WL1, WL3, WL5, and WL7 are arranged in order along the first direction D1 between the two select gate lines SGD2. Subsequently, a contact plug CC is arranged on each of the terraces.

In the step part of the string unit SU3, the terrace of the word line WL7 is arranged between the two select gate lines SGD3. Subsequently, to penetrate this terrace, the contact plugs C4 corresponding to the word lines WL6, WL4, WL2, and WL0, the select gate line SGS, and the word lines WL1, WL3, WL5, and WL7 are arranged in order along the first direction D1.

It should be noted that the terraces and the contact plugs CC of the select gate line SGS and the word lines WL may be formed in the step part of the string unit SU0, and the contact plugs C4 corresponding to the select gate line SGS and the word lines WL may be formed in the step part of the string unit SU1. The step parts of the string units SU2 and SU3 are configured in the same manner. Furthermore, the arrangement of the terraces in the first direction can be discretionarily set.

In addition, in the step part, a plurality of dummy pillars HR are provided, penetrating a plurality of interconnect layers corresponding to the select gate lines SGD and SGS and the word lines WL0 to WL7. The arrangement of the dummy pillars is discretionary. The dummy pillars HR are not electrically coupled to the other interconnects as insulating layers are formed on the side and bottom surfaces of the dummy pillars. The dummy pillar HR functions as a pillar which, when filling air spaces corresponding to the select gate lines SGD and SGS and the word lines WL with, for example, a metal such as tungsten (W), supports an inter-layer insulating film between the select gate lines SGD and SGS and the word lines WL which have become those air spaces.

The dummy step parts are formed in a step-part-forming process. The width of the dummy step part in the first direction D1 is narrower than that of the step part. In the dummy step part, the memory pillar MP, contact plugs CC and C4, etc. are not formed. It should be noted that the dummy step part may not be formed.

1.1.4 Cross-Sectional Configuration of the Memory Cell Array

Next, a cross-sectional configuration of the memory cell array 10 will be described using FIGS. 4 to 6. FIG. 4 is a cross-sectional view of the memory cell array 10 taken along a line A1-A2 shown in FIG. 3. FIG. 5 is a cross-sectional view of the memory cell array 10 taken along a line B1-B2 shown in FIG. 3. FIG. 6 is a cross-sectional view of the memory cell array 10 taken along a line C1-C2 shown in FIG. 3. It should be noted that, to simplify the descriptions, in examples of FIGS. 4 and 5, the circuits provided in a lower layer of the memory cell array 10 are depicted by blocks, and the interconnect layers on the memory pillars MP and the contact plugs CC and C4 are omitted. In addition, in the example of FIG. 6, the circuits arranged below the memory cell array 10 are omitted.

As shown in FIG. 4, on a semiconductor substrate 100, for example, circuits, such as the row decoder 11 and the sense amplifier 13, are formed, and via the insulating layer 101, the memory cell array 10 is formed above these circuits. As the insulating layer 101, for example, a silicon oxide film ($SiO_2$) is used. It should be noted that the circuits arranged below the memory cell array 10 are not limited to the row decoder 11 and the sense amplifier 13. More specifically, in a region of the memory cell array 10, an interconnect layer 102 which functions as a source line SL is formed on the insulating layer 101, and ten interconnect layers 103 which function as the select gate line SGS, the word lines WL0 to WL7, and the select gate line SGD are further stacked thereon via the insulating layers 101 which lie between the interconnect layers. The interconnect layers 102 and 103 are made from conductive materials. For example, metal materials, such as W or TiN, may be used.

In the array parts of the memory cell array 10, the memory pillars MP, which penetrate the ten interconnect layers 103 and bottom surfaces of which are in contact with the interconnect layer 102, are formed.

In the step part of the string unit SU1, terraces of the select gate lines SGD and SGS and the word lines WL0 to WL7 are formed. More specifically, along the first direction D1, a terrace of the select gate line SGD1 is formed; terraces of the even-numbered word lines WL6, WL4, WL2, and WL0 are formed consecutively in a two-stage stepwise shape, a terrace of the select gate line SGS is formed; and terraces of the odd-numbered word lines WL1, WL3, WL5, and WL7 are formed consecutively in a two-stage stepwise shape, and then a terrace of the select gate line SGD1 is formed.

A contact plug CC is formed on each of the terraces. A contact plug C4 corresponding to the select gate line SGD1 is formed so as to penetrate the ten interconnect layers 103 and the interconnect layer 102 to be coupled to the row decoder 11. In the example of FIG. 4, along the first direction D1, a contact plug C4 corresponding to the select gate line SGD1, eleven contact plugs CC corresponding to the select gate line SGD1, the word lines WL6, WL4, WL2, and WL0, the select gate line SGS, the word lines WL1, WL3, WL5, and WL7, and the select gate line SGD1, and a contact plug C4 corresponding to the select gate line SGD1 are arranged in order.

As shown in FIG. 5, in the step part of the string unit SU0, the terraces of the select gate line SGD0 and the word line WL7 are formed. In the terrace of the word line WL7, the contact plugs C4 corresponding to the select gate line SGS and word lines WL0 to WL7 are formed so as to penetrate nine interconnect layers 103 corresponding to the select gate line SGS and word lines WL0 to WL7 and the interconnect layer 102, and to be coupled to the row decoder 11. A contact plug CC is formed on the terrace of the select gate lines SGD0. In addition, a contact plug C4 corresponding to the select gate line SGD0 is formed to penetrate the ten interconnect layers 103 and interconnect layer 102 to be coupled to the row decoder 11. In an example of FIG. 5, along the first direction D1, the contact plugs C4 and CC corresponding to the select gate lines SGD0, nine contact plugs C4 corresponding to the word lines WL6, WL4, WL2, and WL0, the select gate line SGS, and the word lines WL1, WL3, WL5, and WL7, and contact plugs CC and C4 corresponding to the select gate lines SGD0 are arranged in order.

Next, details of a cross-sectional configuration of the memory pillar MP will be described.

As shown in FIG. 6, the interconnect layer 102 that functions as a source line SL is common to the string units SU0 to SU3. The slit SLT is formed between the string units SU1 and SU2 and extends along the first direction D1, also separating the ten interconnect layers 103. It should be noted that the slit SLT is also formed between the blocks BLK (not depicted in the drawings). A slit SHE is formed between the string units SU0 and SU1, and between the string units SU2 and SU3. The slit SHE formed between the string units SU0 and SU1 separates the select gate lines SGD0 and SGD1. The slit SHE formed between the string units SU2 and SU3 separates the select gate lines SGD2 and SGD3.

On the semiconductor substrate 100, the insulating layer 101 is formed via a circuit, such as a sense amplifier (not depicted in the drawings), etc., and the interconnect layer 102 that functions as a source line SL is formed thereon.

On the interconnect layer 102, the ten interconnect layers 103 that function as, from the lower layer, the select gate line SGS, the word lines WL0 to WL7, and the select gate line SGD are formed via the insulating layers 101 which lie between the interconnect layers.

The memory pillar MP includes a block insulating film 107, a charge storage layer 106, a tunnel insulating film 105, and a semiconductor layer 104. Then, by the memory pillar MP and the word lines WL0 to WL7, memory cell transistors MT0 to MT7 are constituted. Similarly, by the memory pillar MP and the select gate lines SGD and SGS, the select transistors ST1 and ST2 are constituted.

More specifically, a memory hole is formed to penetrate the ten interconnect layers 103 and the insulating layers 101 to reach the interconnect layer 102 so as to form the memory pillar MP. On a side surface of the memory hole, the block insulating film 107, the charge storage layer 106, and the tunnel insulating film 105 are sequentially formed. An inner portion of the memory hole is filled with the semiconductor layer 104. The semiconductor layer 104 constitutes a region where the memory cell transistor MT and channels of the select transistors ST1 and ST2 are formed. $SiO_2$, for example, can be used as the block insulating film 107 and the tunnel insulating film 105. SiN, for example, may be used as the charge storage layer 106. It should be noted that the charge storage layer 106 may be made from conductive materials surrounded by insulating materials to achieve a floating gate structure. Polycrystal silicon, for example, may be used for the semiconductor layer 104.

On the memory pillar MP, a contact plug 109 for coupling to interconnects in upper layers is formed. The contact plug 109 is formed from a conductive material. For example, a metal material, such as W or TiN, or phosphate (P)-doped Si, etc. may be used.

On the contact plug 109, an interconnect layer 110 that functions as a bit line BL is formed. The interconnect layer 110 may be formed from a conductive material, and a metal material, such as W, TiN or etc., may be used, for example.

1.2 Method of Forming the Step Part

Next, a method of forming the step part will be described using FIGS. 7-18. FIGS. 7-18 illustrate a region RA in FIG. 3, i.e., a plan surface of a step part corresponding to one block BLK, a cross section taken along the line A1-A2 (hereinafter, referred to as "the A1-A2 cross section"), and a cross section taken along the line B1-B2 (hereinafter, referred to as "the B1-B2 cross section"), respectively. In the present embodiment, a method of removing and then filling by conductive materials the sacrifice layers 120 to form the interconnect layers 103 after the formation of structures corresponding to the interconnect layers 103 by the sacrifice layers 120 (hereinafter, referred to as "backfill") will be described. In the following, a case where silicon nitride film (SiN) is used as the sacrifice layers 120, and a lamination film of TiN and W is used as a conductive material will be explained. When forming a film of W, TiN functions as a barrier layer which, for example, prevents reaction between W and the undercoat Si, or as an adhesion layer for improving adhesion of W. It should be noted that the sacrifice layer 120 is not limited to SiN. For example, the sacrifice layer 120 may be silicon oxide nitride film (SiON), and may be any material that can provide a selection ratio of the insulating layer 101 (e.g., $SiO_2$) and wet etch. In addition, the conductive material of the interconnect layer 103 is not limited to a lamination film of TiN and W. It should be noted that, in the examples of FIGS. 7-18, the interconnect layer 102 and the dummy pillars HR are omitted for simplification of the descriptions.

Figure 7:
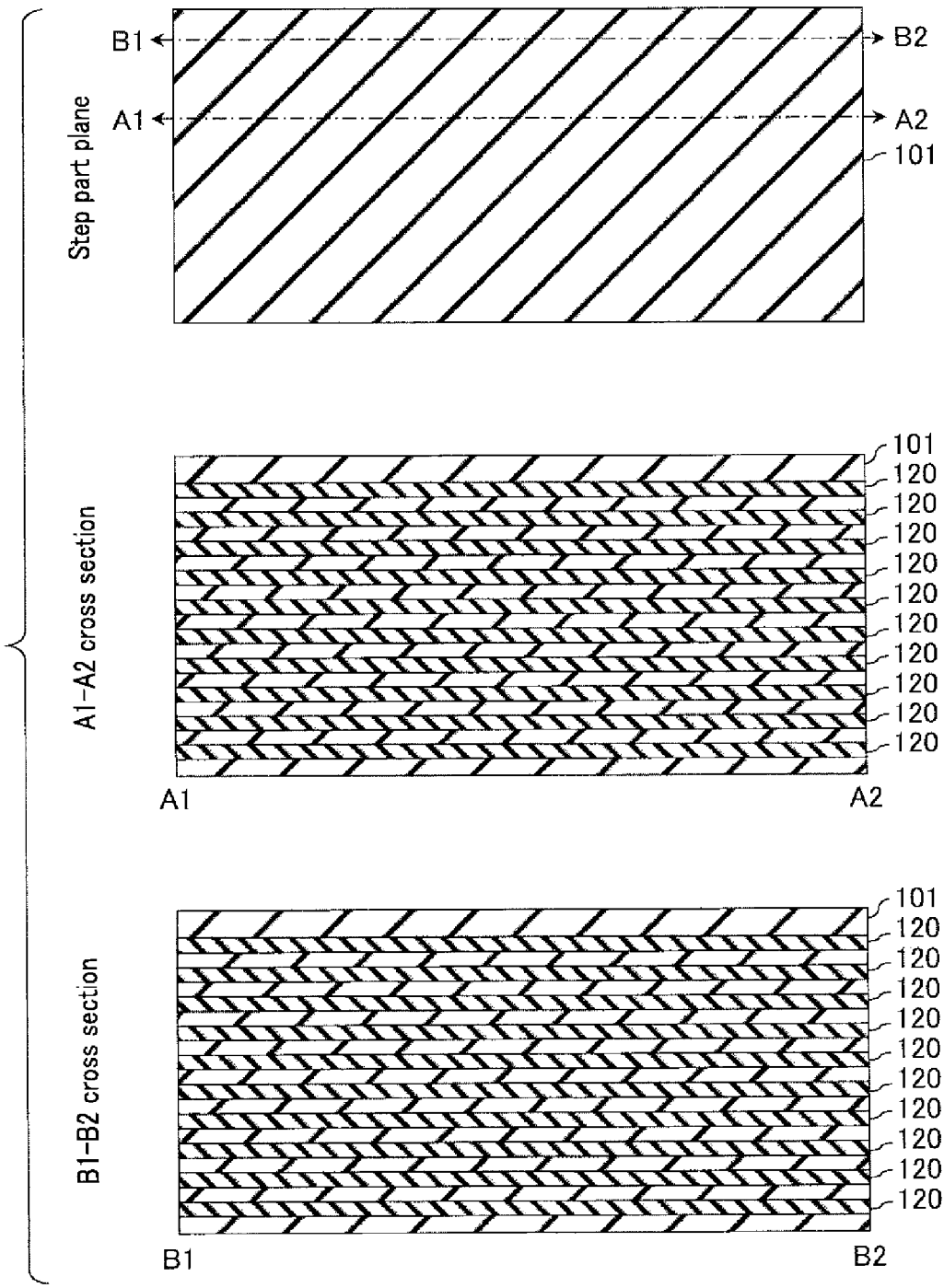
FIGS. 7-18 are diagrams illustrating a manufacturing process of a step part of the memory cell array in the semiconductor memory device according to the first embodiment.

As shown in FIG. 7, ten sacrifice layers 120 corresponding to the interconnect layers 103 are stacked on the interconnect layer 102 (not depicted in the drawings) via the insulating layers 101 between the sacrifice layers 120, and the insulating layer 101 is further formed on the uppermost sacrifice layer 120.

Figure 8:
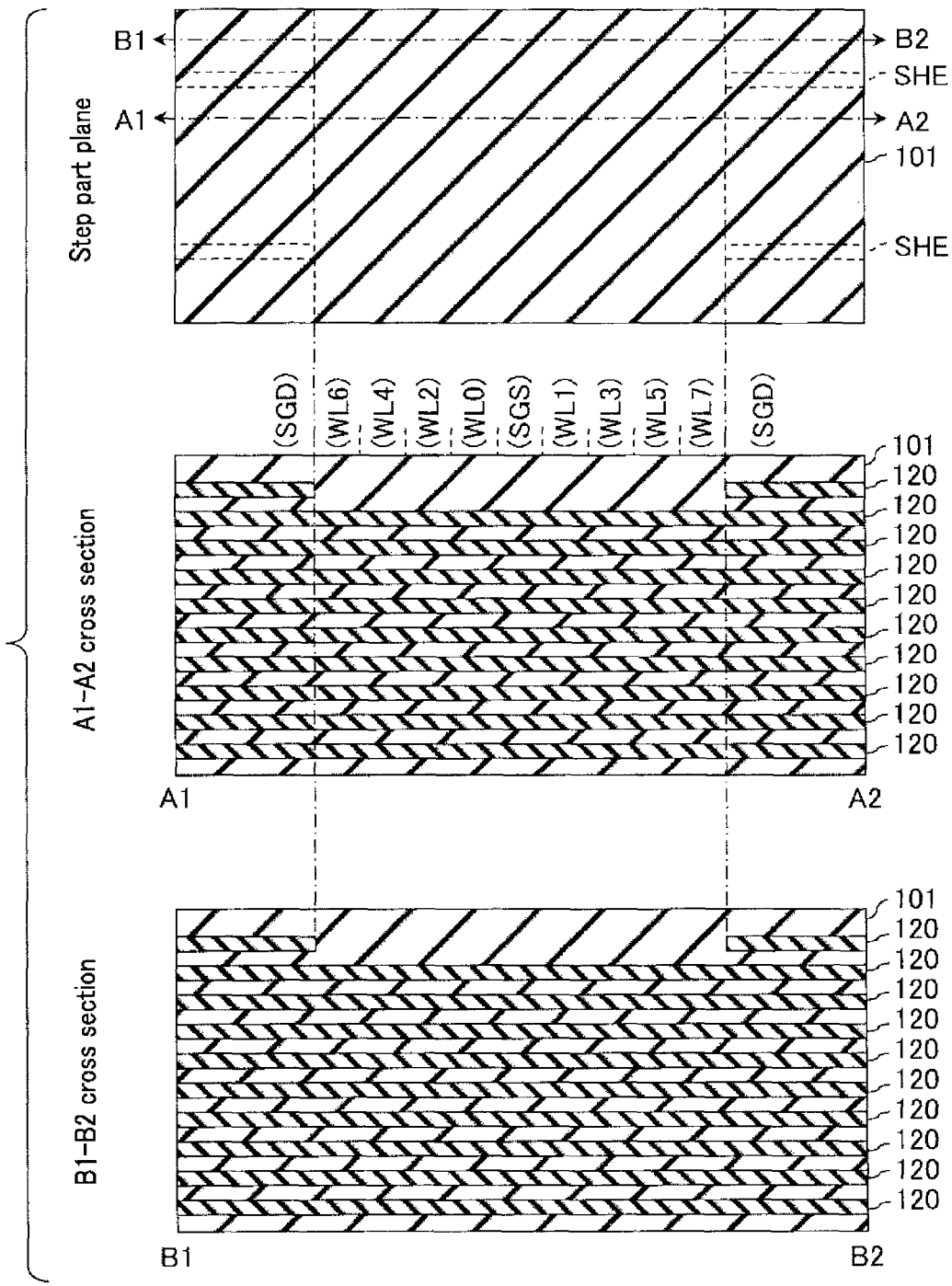

As shown in FIG. 8, next, the uppermost sacrifice layer 120 is processed in regions corresponding to the terraces of the word lines WL0 to WL7 and the select gate line SGS, the slit SHE between the string units SU0 and SU1, and the slit SHE between the string units SU2 and SU3. Then, a portion in which the sacrifice layer 120 was removed is filled with the insulating layer 101. Thus, in part of the regions depicted in the A1-A2 cross section and the B1-B2 cross section, the uppermost sacrifice layer 120 is removed.

Figure 9:
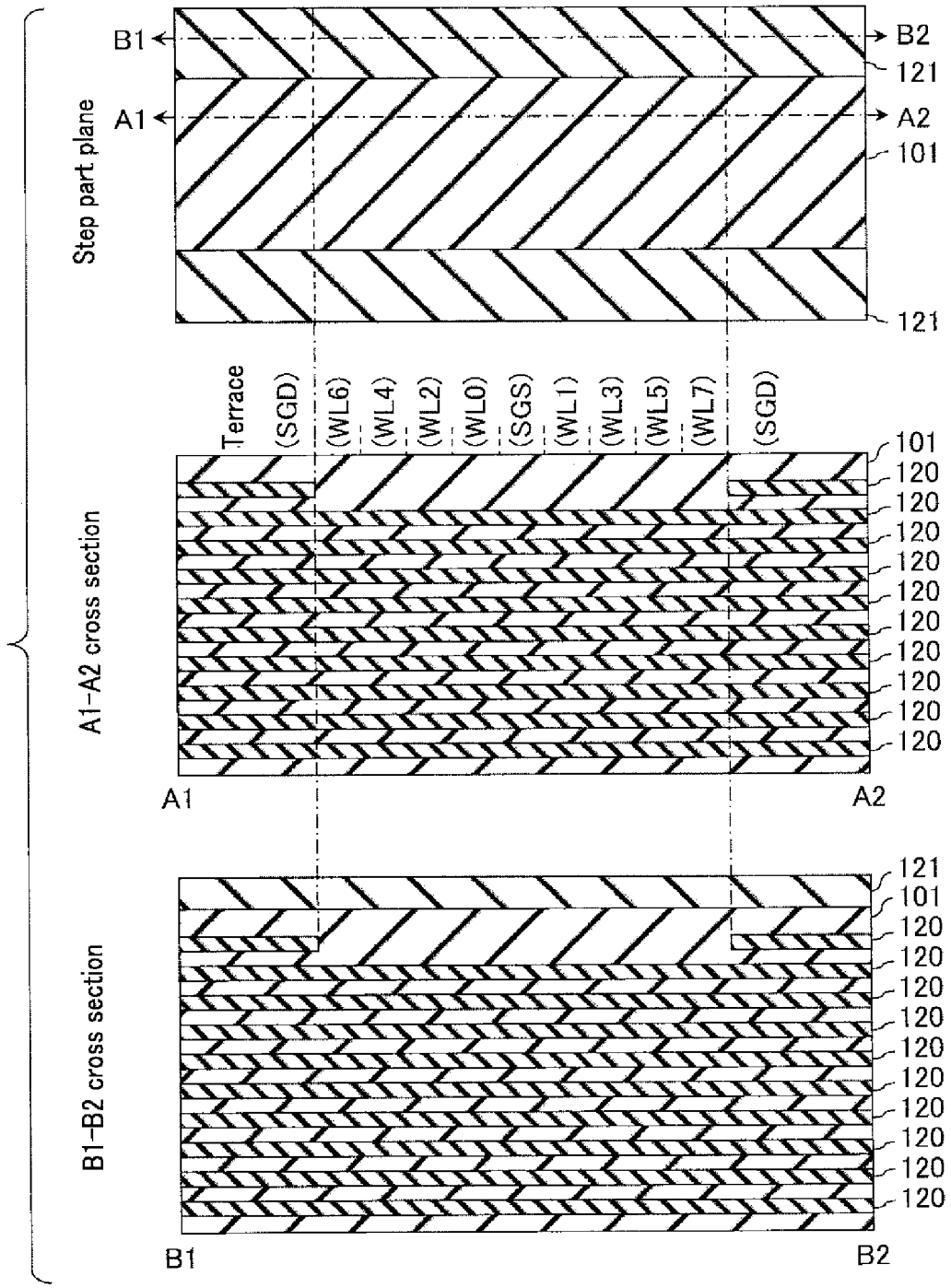

As shown in FIG. 9, next, a protection layer 121 is formed in the step parts of the string units SU0 and SU3. The protection layer 121 functions as a mask when processing the step parts. In the following, a case where polycrystal Si is used as the protection layer 121 will be described. It should be noted that the protection layer 121 is not limited to polycrystal Si. The protection layer 121 may be any material that can provide a sufficient selection ratio of the insulating layers 101 and the sacrifice layers 120, and dry etch.

Figure 10:
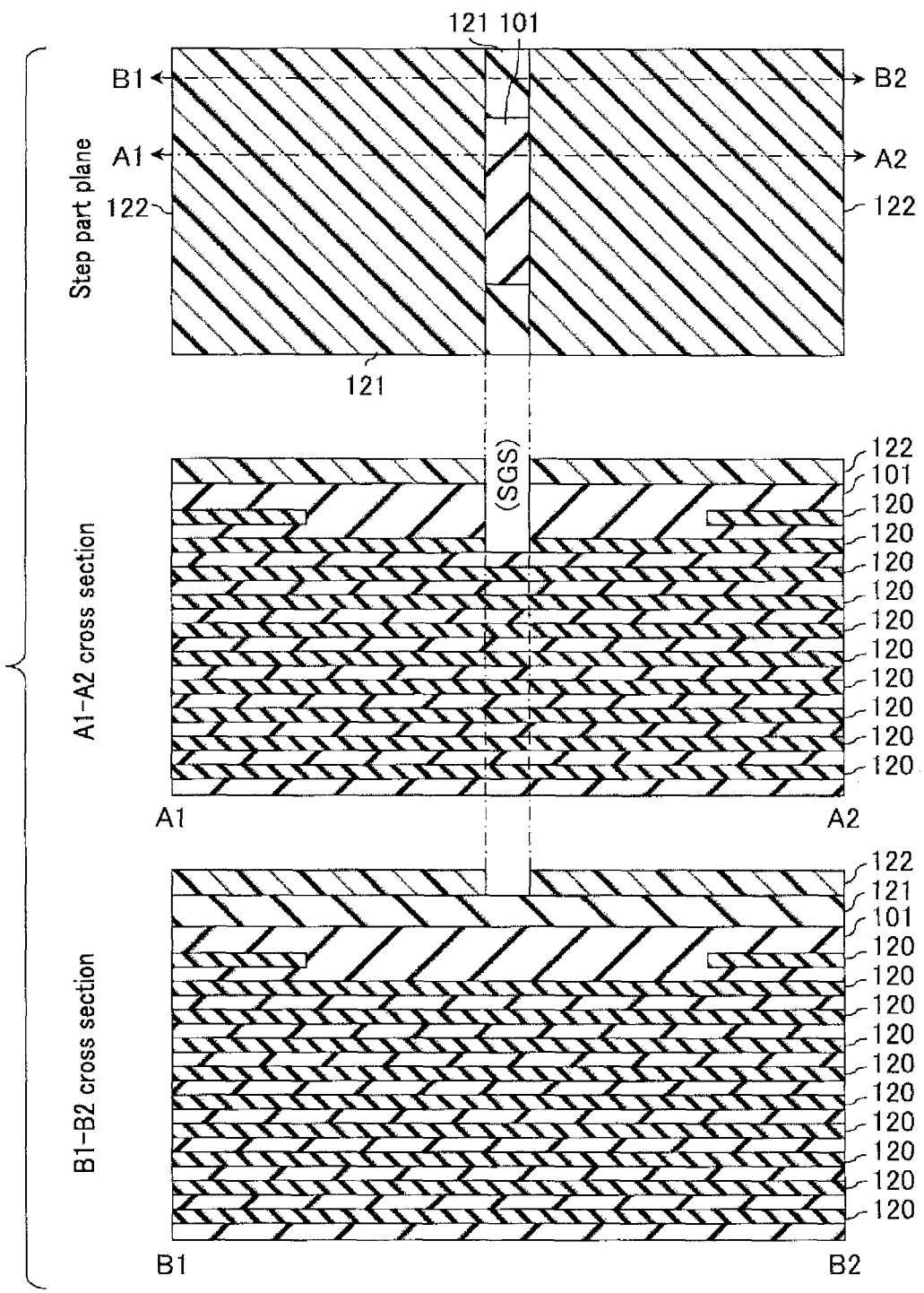

As shown in FIG. 10, next, a resist pattern 122 for processing a region of the terrace portion (a terrace region) of the select gate line SGS is formed using a lithography technique. Then, the insulating layers 101 and the sacrifice layers 120 are processed one layer each. Thus, in the terrace region of the select gate line SGS depicted in the A1-A2 cross section, the two uppermost sacrifice layers 120 are removed. In addition, in the terrace regions of the word lines WL0 to WL7, the uppermost sacrifice layer 120 is removed. At this time, in the region depicted in the B1-B2 cross section, since the upper layers are protected by the protection layer 121, the insulating layers 101 and the sacrifice layers 120 are not processed.

Figure 11:
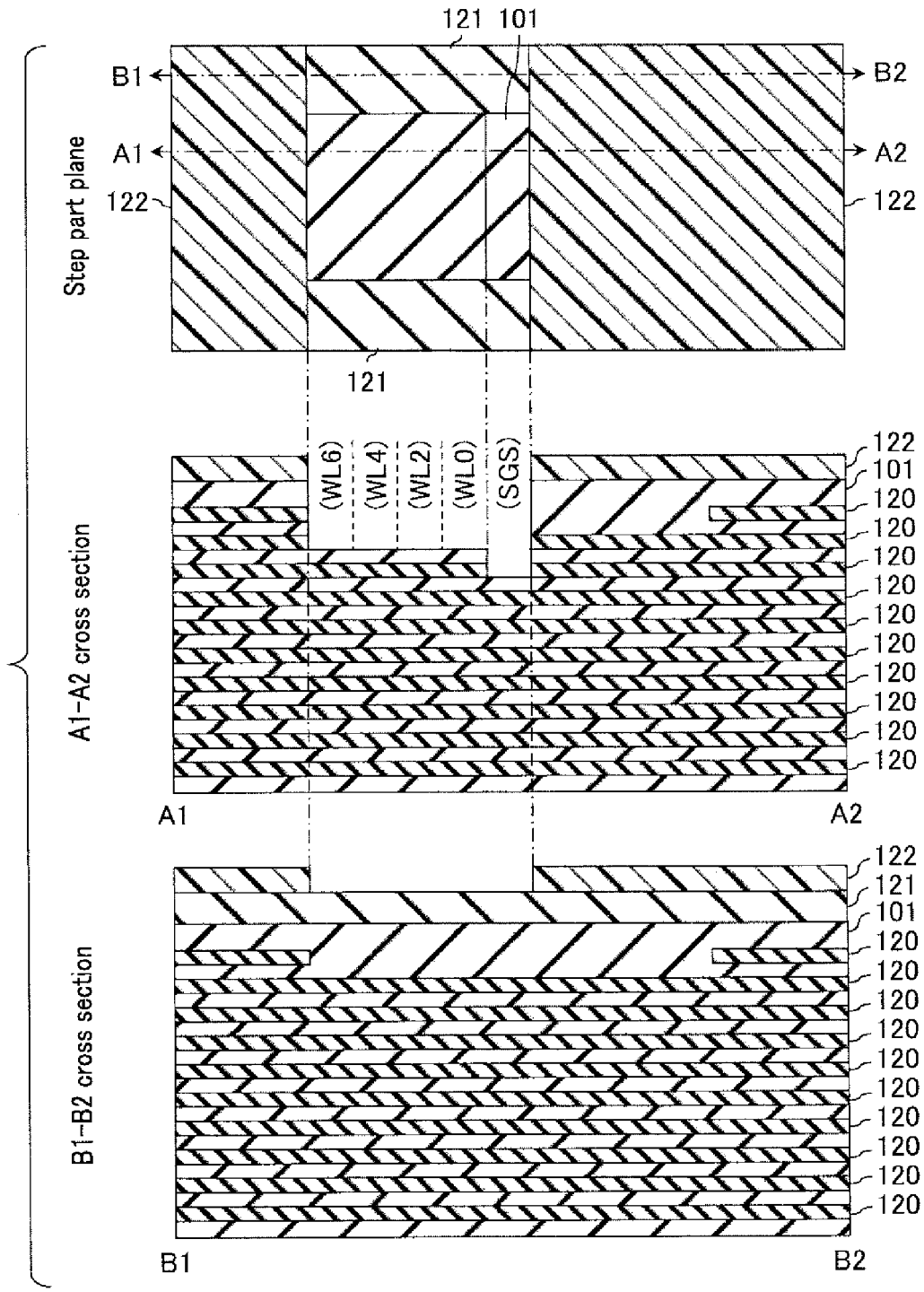

As shown in FIG. 11, next, a resist pattern 122 is formed for processing the terrace regions of the even-numbered word lines WL 6, WL4, WL2, and WL0 and the select gate line SGS. Then, the insulating layers 101 and the sacrifice layers 120 are processed one layer each. Thus, in the terrace regions of the even-numbered word lines WL6, WL4, WL2, and WL0 depicted in the A1-A2 cross section, the two uppermost sacrifice layers 120 are removed. In the terrace region of the select gate line SGS, the three uppermost sacrifice layers 120 are removed. In addition, in the terrace regions of the odd-numbered word lines WL1, WL3, WL5, and WL7, the uppermost sacrifice layer 120 is removed. At this time, in the region depicted in the B1-B2 cross section, since the upper layers are protected by the protection layer 121, the insulating layers 101 and the sacrifice layers 120 are not processed.

Figure 12:
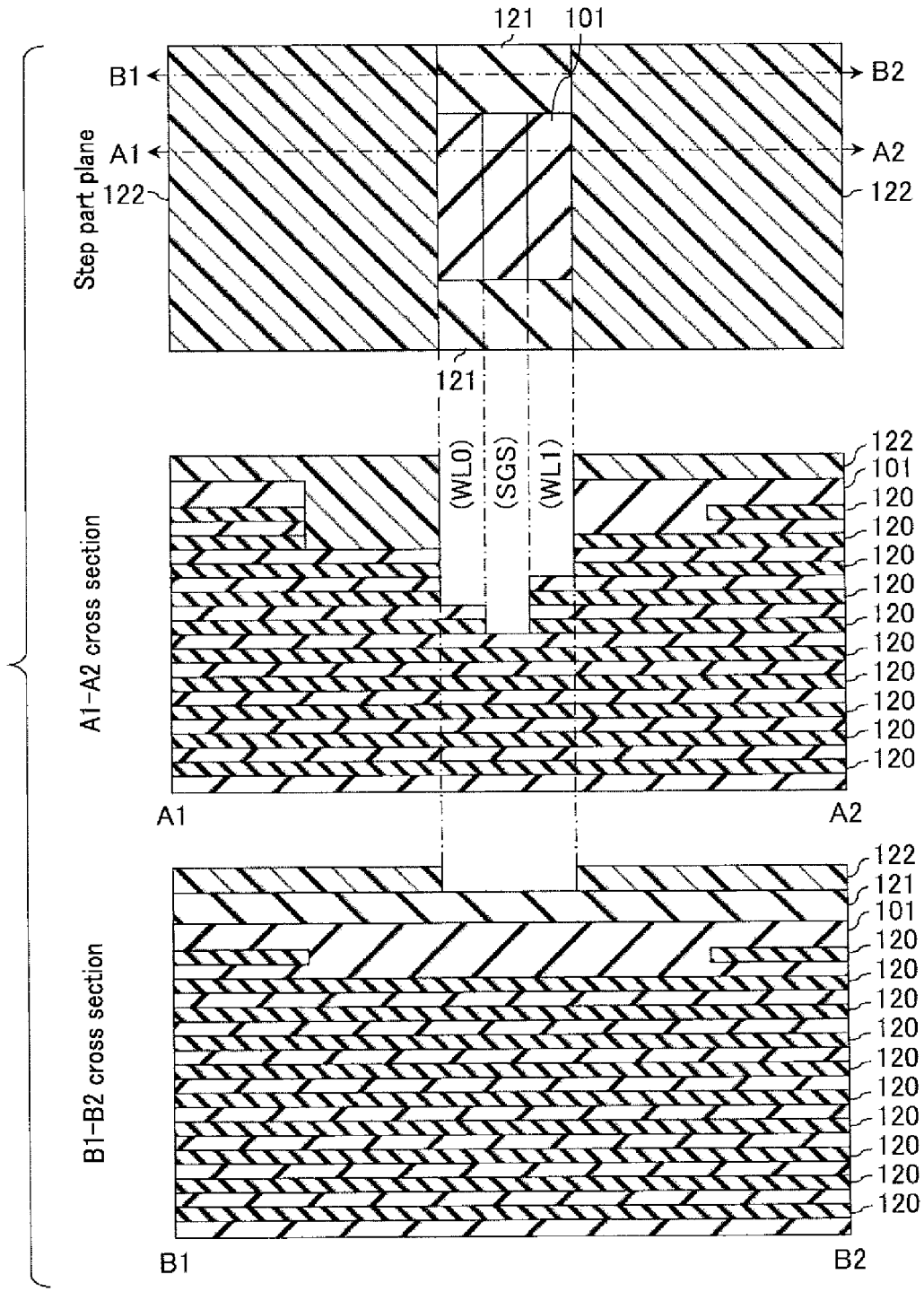

As shown in FIG. 12, next, a resist pattern 122 is formed for processing the terrace regions of the word line WL0, the select gate line SGS, and the word line WL1. Then, the insulating layers 101 and the sacrifice layers 120 are processed two layers each. Thus, in the terrace region of the word line WL0 depicted in the A1-A2 cross section, the four uppermost sacrifice layers 120 are removed. In the terrace region of the select gate line SGS, the five uppermost sacrifice layers 120 are removed. In the terrace region of the word line WL1, the three uppermost sacrifice layers 120 are removed. In addition, in the terrace regions of the word lines WL6, WL4, and WL2, the two uppermost sacrifice layers 120 are removed, and in the terrace regions of the word lines WL3, WL5, and WL7, the uppermost sacrifice layer 120 is removed. At this time, in the region depicted in the B1-B2 cross section, since the upper layers are protected by the protection layer 121, the insulating layers 101 and the sacrifice layers 120 are not processed.

Figure 13:
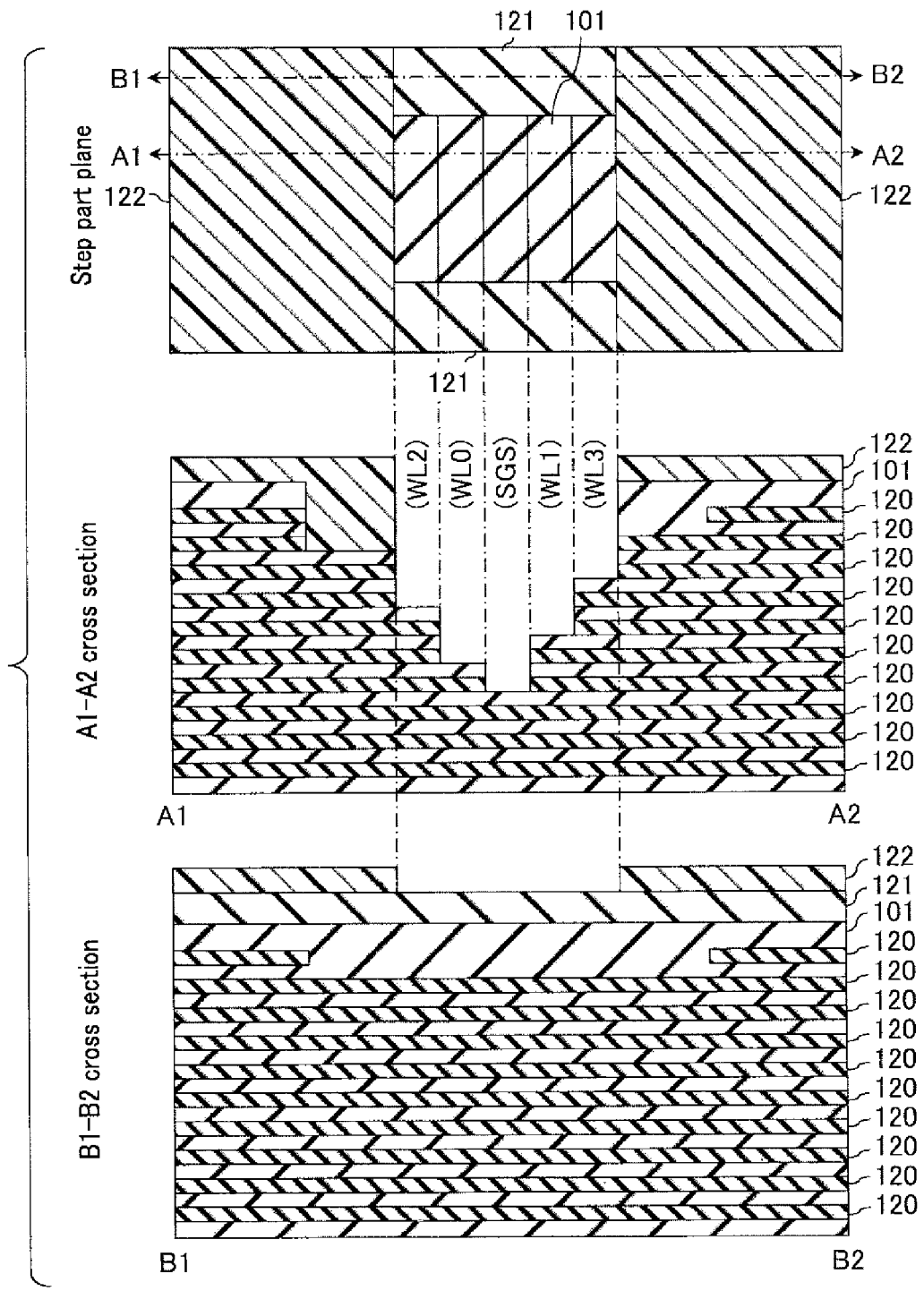

As shown in FIG. 13, next, a resist pattern 122 is formed for processing the terrace regions of the word lines WL2 and WL0, the select gate line SGS, and the word lines WL1 and WL3. Then, the insulating layers 101 and the sacrifice layers 120 are processed two layers each. Thus, in the terrace region of the word line WL2 depicted in the A1-A2 cross section, the four uppermost sacrifice layers 120 are removed. In the terrace region of the word line WL0, the six uppermost sacrifice layers 120 are removed. In the terrace region of the select gate line SGS, the seven uppermost sacrifice layers 120 are removed. In the terrace region of the word line WL1, the five uppermost sacrifice layers 120 are removed. In the terrace region of the word line WL3, the three uppermost sacrifice layers 120 are removed. In addition, in the terrace regions of the word lines WL6 and WL4, the two uppermost sacrifice layers 120 are removed, and in the terrace regions of the word lines WL5 and WL7, the uppermost sacrifice layer 120 is removed. At this time, in the region depicted in the B1-B2 cross section, since the upper layers are protected by the protection layer 121, the insulating layers 101 and the sacrifice layers 120 are not processed.

Figure 14:
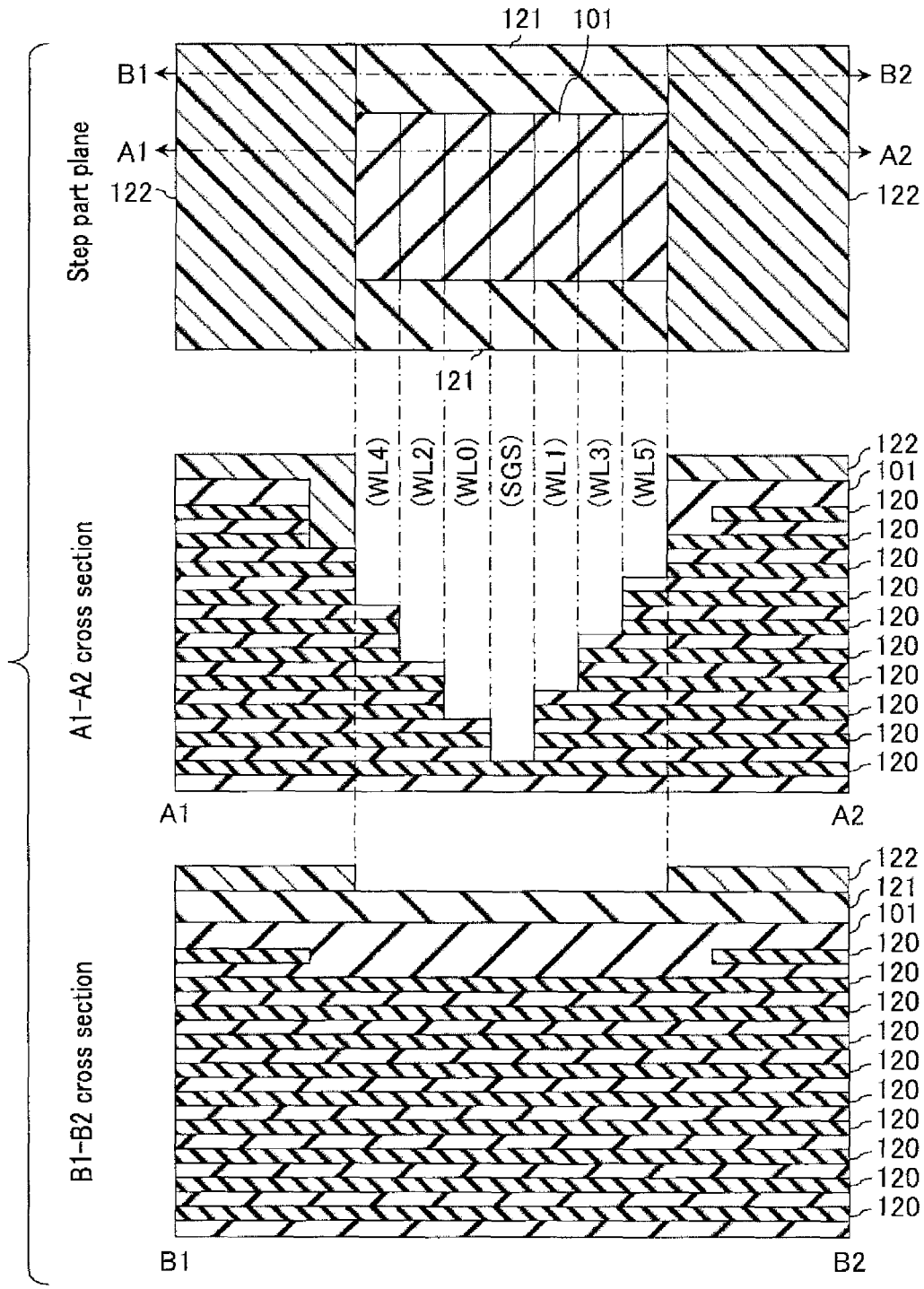

As shown in FIG. 14, next, a resist pattern 122 is formed for processing the terrace regions of the word lines WL4, WL2, and WL0, the select gate line SGS, and the word lines WL1, WL3, and WL5. Then, the insulating layers 101 and the sacrifice layers 120 are processed two layers each. Thus, in the terrace region of the word line WL6 depicted in the A1-A2 cross section, the two uppermost sacrifice layers 120 are removed. In the terrace region of the word line WL4, the four uppermost sacrifice layers 120 are removed. In the terrace region of the word line WL2, the six uppermost sacrifice layers 120 are removed. In the terrace region of the word line WL0, the eight uppermost sacrifice layers 120 are removed. In the terrace region of the select gate line SGS, the nine uppermost sacrifice layers 120 are removed. In the terrace region of the word line WL1, the seven uppermost sacrifice layers 120 are removed. In the terrace region of the word line WL3, the five uppermost sacrifice layers 120 are removed. In the terrace region of the word line WL5, the three uppermost sacrifice layers 120 are removed. In addition, in the terrace region of the word line WL7, the uppermost sacrifice layer 120 is removed. At this time, in the region depicted in the B1-B2 cross section, since the upper layers are protected by the protection layer 121, the insulating layers 101 and the sacrifice layers 120 are not processed.

Figure 15:
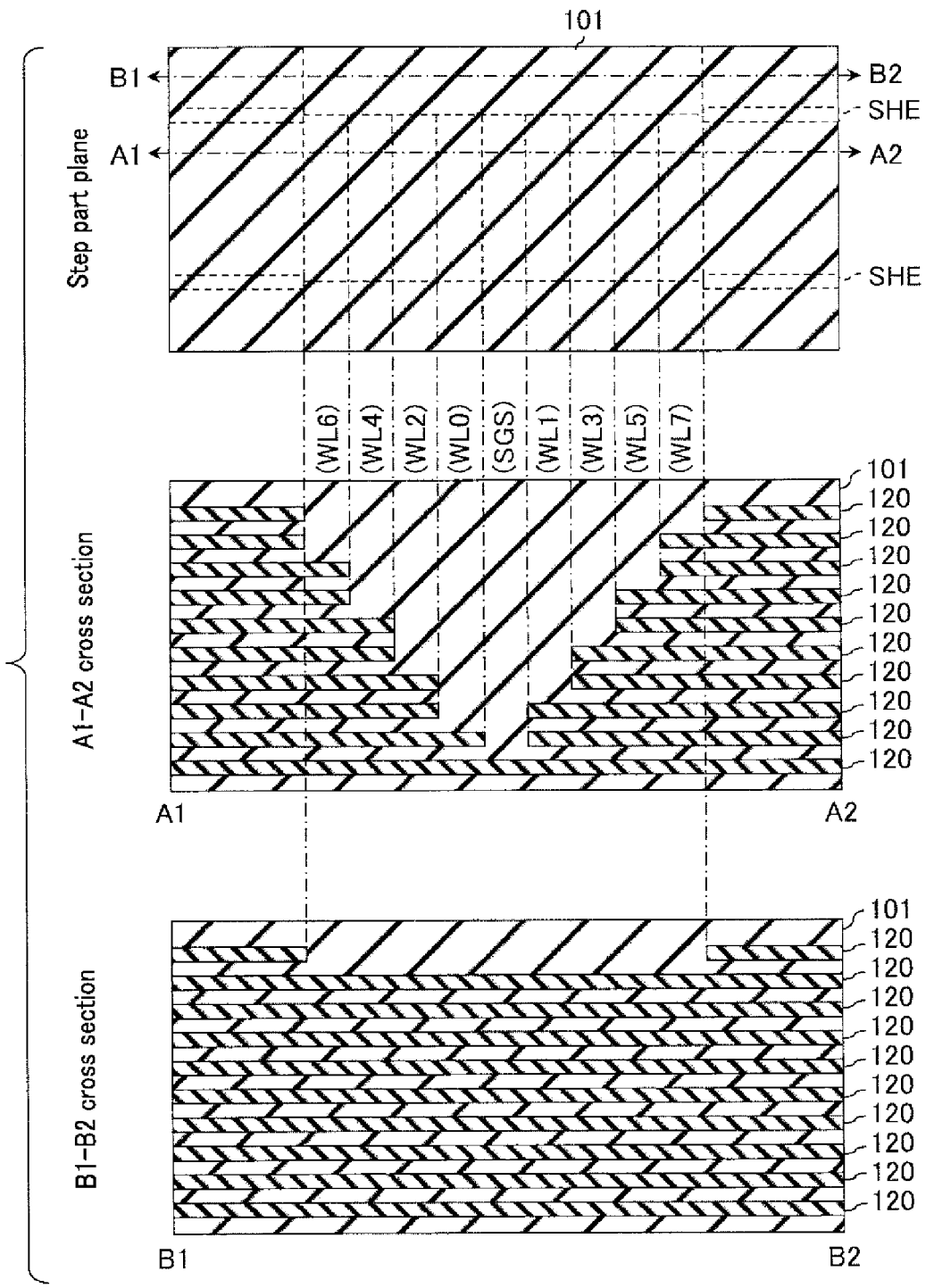

As shown in FIG. 15, next, after removing the resist pattern 122 and the protection layer 121, the terrace regions of the word lines WL0 to WL7 and the select gate line SGS are filled with the insulating layers 101, and the surface of the insulating layers 101 is planarized by, for example, CMP, etc. Thereafter, for example, the memory pillars MP and the dummy pillars HR are formed.

Figure 16:
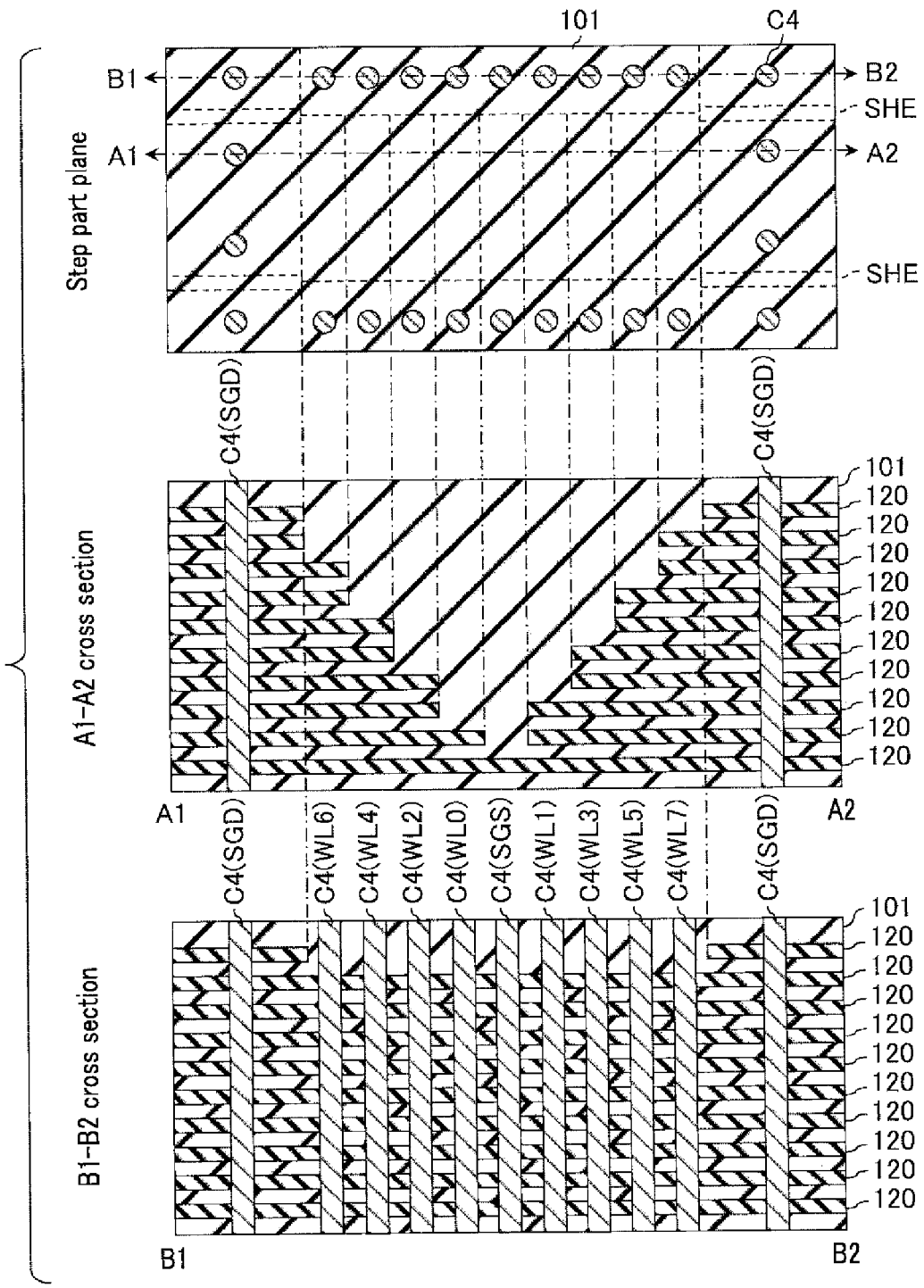

As shown in FIG. 16, next, the contact plugs C4 corresponding to the word lines WL0 to WL7 and the select gate lines SGD and SGS are formed.

Figure 17:
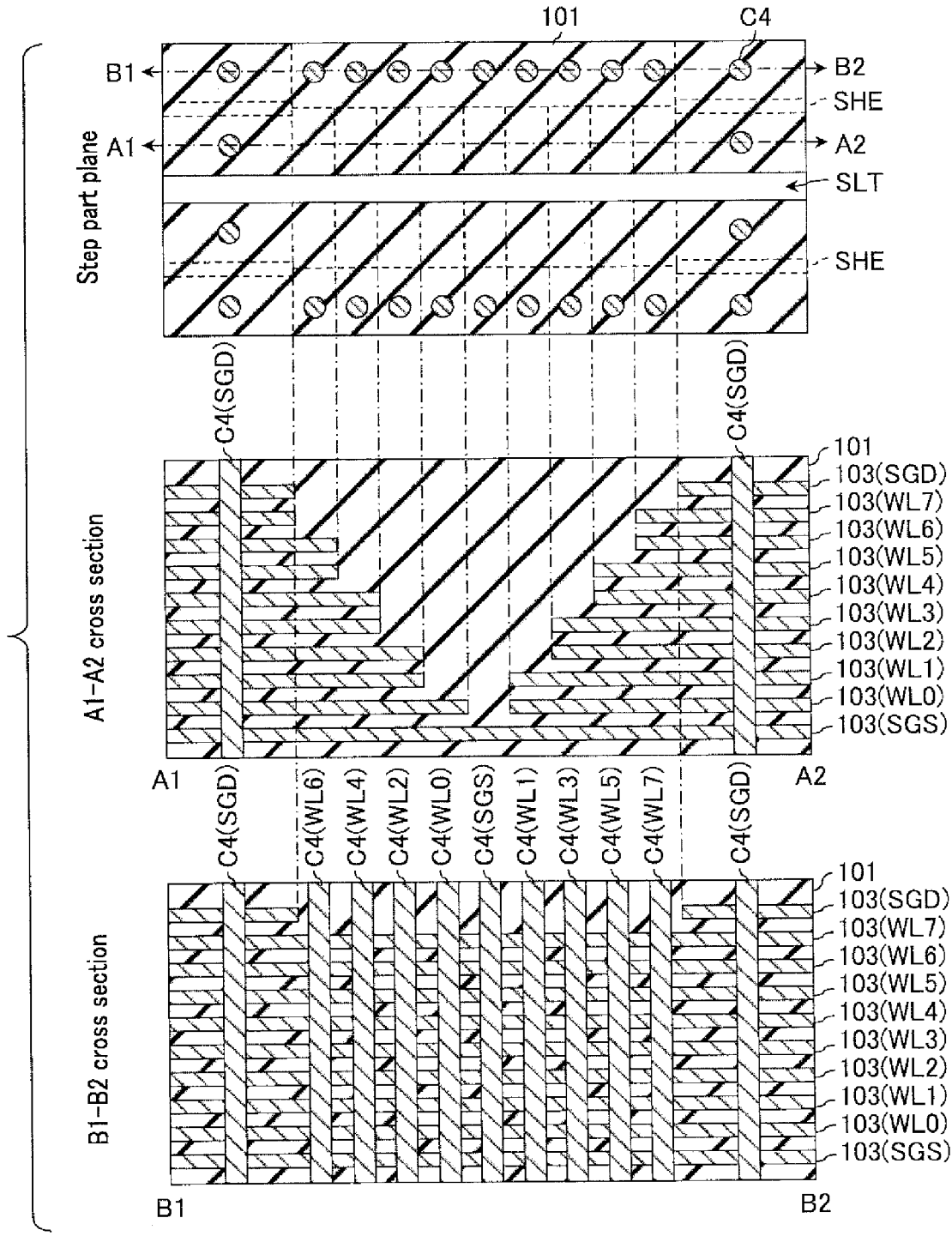

As shown in FIG. 17, first, the slit SLT is processed to form a groove pattern. Next, the sacrifice layers 120 are backfilled with W and TiN to form the interconnect layers 103. More specifically, in a case where the sacrifice layers 120 are SiN, wet etch using phosphoric acid ($H_3PO_4$) is performed. Thus, the sacrifice layers 120 are etched from the groove pattern of the slit SLT, and air spaces are formed in portions where the sacrifice layers 120 were present. Next, films of TiN and W are formed in order, and the air spaces are filled. Next, after the TiN and W formed on the side surfaces and bottom portion of the slit and the insulating layers 101 are removed to form the interconnect layers 103, the groove pattern of the slit SLT is filled with $SiO_2$.

Figure 18:
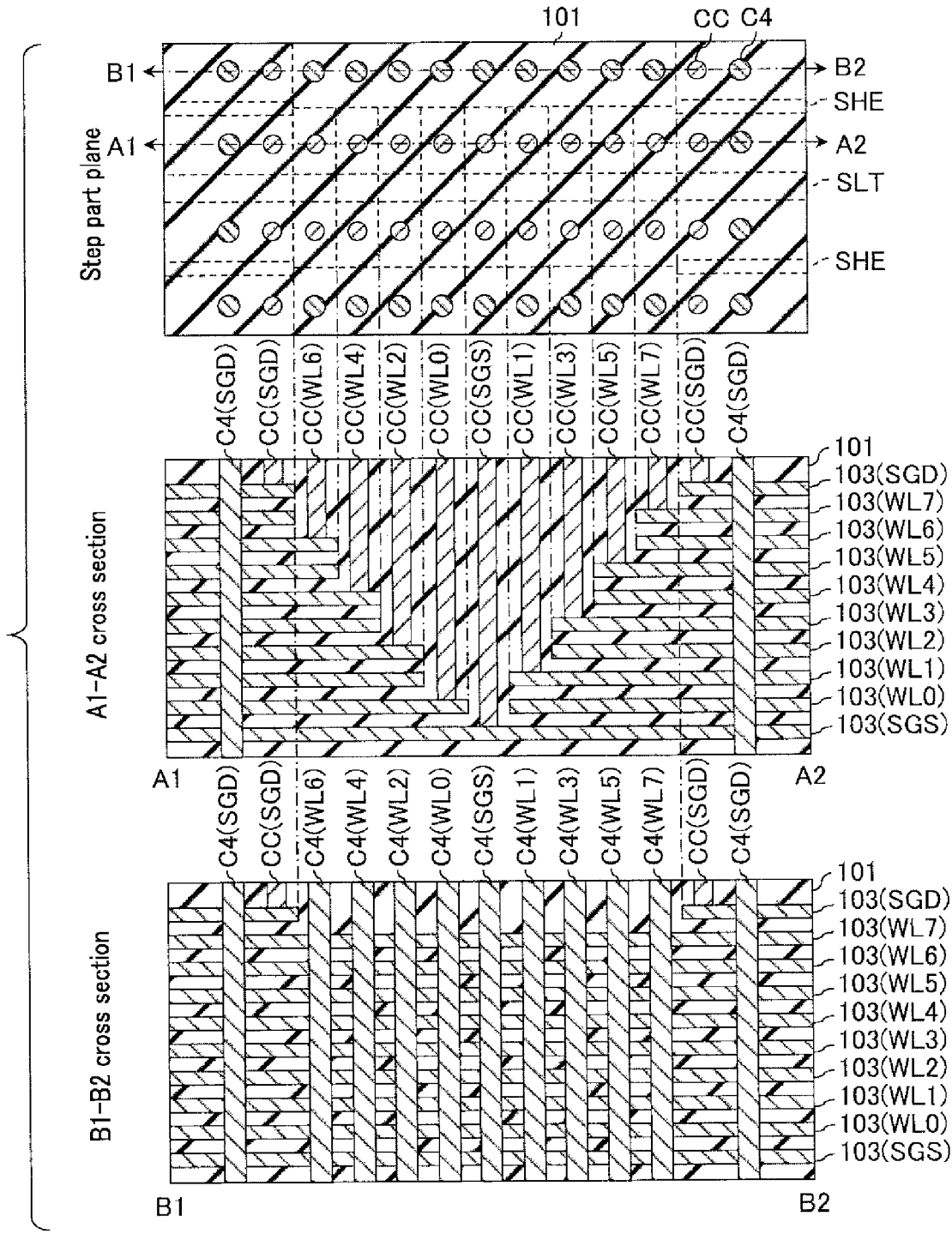

As shown in FIG. 18, next, the contact plugs CC are formed on the terraces of the word lines WL0 to WL7 and the select gate lines SGD and SGS.

1.3 Advantageous Effect According to the Present Embodiment

The configuration according to the present embodiment allows for improved processing capabilities. This effect will be described in the following.

In a three-dimensional stacked NAND flash memory, a plurality of interconnect layers that function as the word lines WL are stacked over the semiconductor substrate. The plurality of stacked interconnect layers are led out stepwise, and coupled to the row decoder 11 via the contact plugs CC. Thus, the distance from the contact plug CC to the memory pillar MP becomes long, i.e., as the interconnect length of the word line WL becomes long, the RC delay becomes greater because of increase in interconnect resistance and interconnect capacitance.

A specific example of the interconnect length of the word line WL will be described using FIG. 19. In the upper row of FIG. 19, a cross section of the memory cell array in a case of providing a step part at an end portion of the memory cell array is depicted as a comparative example, and in the lower row of FIG. 19, a cross section of the memory cell array in the present embodiment is depicted. It should be noted that in the example of FIG. 19, for simplification of the descriptions, the source line SL and the select gate lines SGD and SGS are omitted, and the word lines WL4 to WL7 are depicted as a part of the plurality of word lines WL.

Figure 19:
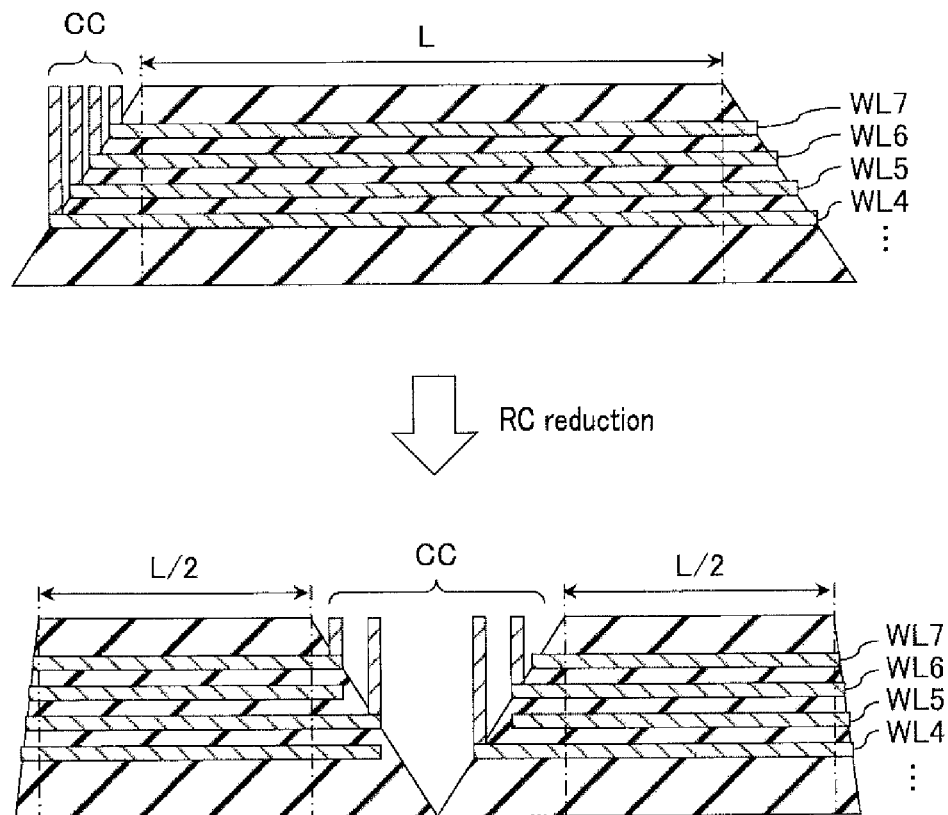
FIG. 19 is a cross-sectional view of a memory cell array of a comparative example, and the memory cell array in the semiconductor memory device according to the first embodiment.

As shown in FIG. 19, assuming that an interconnect length from the contact plugs CC to an end portion of the word lines WL in a case where the step part is provided at an end portion of the memory cell array as a comparative example is L, in a case of applying the present embodiment to provide the step part in the center of the memory cell array, an interconnect length from the contact plugs CC to the end portion of the word lines WL is L/2, and the interconnect resistance and interconnect capacitance can be reduced to almost half. Accordingly, the RC can be reduced.

In this way, based on the configuration of the present embodiment, the step part can be provided in the center of the memory cell array 10, i.e., between the two array parts. Thus, in the memory pillars MP arranged at the end portion of the word lines WL, the resistance value and the interconnect capacitance of the word lines WL are reduced to almost half, and thus the RC delay can be reduced. Therefore, a delay of propagation velocity of a signal in the word lines WL can be reduced, and the semiconductor memory device is allowed to have improved processing capabilities.

Furthermore, since the interconnect length of the word lines WL becomes almost ½, a voltage drop in the word lines WL can be reduced. Accordingly, variations in voltage of the word lines WL due to the interconnect length of the word lines WL can be reduced, and erroneous writing and reading can be reduced. Thus, reliability of the semiconductor memory device can be enhanced.

2. Second Embodiment

Next, a second embodiment will be described. In the second embodiment, an arrangement of terraces which differs from that of the first embodiment will be described. In the following, only the matters which differ from the first embodiment will be described.

2.1 Plane Configuration of the Memory Cell Array

First, a plane configuration of the memory cell array 10 will be described using FIG. 20. FIG. 20 is a plan view of the string units SU0 to SU4 in one block BLK. It should be noted that in the example of FIG. 20, the inter-layer insulating film is omitted.

As shown in FIG. 20, in the memory cell array 10 in the present embodiment, in the string units SU0 to SU4, the word lines WL and the select gate line SGS are shared. The select gate lines SGD0 and SGD1 are separated by the slit SHE. Similarly, the select gate lines SGD2 and SGD3 are separated by the slit SHE. In addition, the select gate lines SGD1 and SGD2 are separated by the slits SHE and SLT. Namely, the slit SLT is formed in a part between the string units SU1 and SU2. Accordingly, between the string units SU1 and SU2, in the region where the slit SHE is formed, the select gate line SGS and the word lines WL are coupled.

Similarly to FIG. 3 of the first embodiment, the memory cell array 10 is constituted by two array parts, a step part, and two dummy step parts.

In the step part of the present embodiment, the terraces of the word lines WL0 to WL7 are arranged in two parallel rows along the first direction D1.

More specifically, in the step part of the string unit SU0, the terrace of the word line WL7 is formed between the two terraces corresponding to the select gate line SGD0. Then, along the first direction D1, the contact plugs C4 and CC corresponding to the select gate line SGD0, the contact plugs C4 corresponding to the word lines WL6, WL2, WL3 and WL7, and the contact plugs CC and C4 corresponding to the select gate line SGD0 are arranged in order.

In the step part of the string unit SU1, the terraces of the word lines WL6, WL2, WL3, and WL7 are formed along the first direction D1 between the two terraces corresponding to the select gate line SGD1. Then, along the first direction D1, the contact plugs C4 and CC corresponding to the select gate line SGD1, the contact plugs CC corresponding to the word lines WL6, WL2, WL3, and WL7, and the contact plugs CC and C4 corresponding to the select gate line SGD1 are arranged in order.

In the step part of the string unit SU2, the terraces of the word lines WL4 and WL0, the select gate line SGS, and the word lines WL1 and WL5 are formed along the first direction D1 between the two terraces corresponding to the select gate line SGD2. Then, along the first direction D1, the contact plugs C4 and CC corresponding to the select gate line SGD2, the contact plugs CC corresponding to the word lines WL4 and WL0, the select gate line SGS, and the word lines WL1 and WL5, and the contact plugs CC and C4 corresponding to the select gate line SGD2 are arranged in order.

In the step part of the string unit SU3, the terrace of the word line WL7 is formed between two terraces corresponding to the select gate line SGD3. Then, along the first direction D1, the contact plugs C4 and CC corresponding to the select gate line SGD3, the contact plugs C4 corresponding to the word lines WL4 and WL0, the select gate line SGS, and the word lines WL1 and WL5, and the contact plugs CC and C4 corresponding to the select gate line SGD3 are arranged in order.

It should be noted that the arrangement of the terraces and the contact plugs CC and C4 in the step parts of the string units SU0 to SU3 can be discretionarily set.

In addition, in the step part, a plurality of dummy pillars HR are provided, penetrating a plurality of interconnect layers corresponding to the select gate lines SGD and SGS and the word lines WL0 to WL7. The arrangement of the dummy pillars is discretionary.

2.2 Method of Forming the Step Part

Next, the method of forming the step part will be described using FIGS. 21 to 31. FIGS. 21 to 31 illustrate the region RB in FIG. 20, i.e., a plan view of the step part corresponding to one block BLK, a cross section taken along a line D1-D2 (hereinafter, referred to as "the D1-D2 cross section"), and a cross section taken along a line E1-E2 (hereinafter, referred to as "the E1-E2 cross section"), respectively. It should be noted that, in examples of FIGS. 21 to 31, for simplification of the descriptions, the interconnect layer 102 that functions as a source line SL and the dummy pillars HR are omitted.

Figure 21:
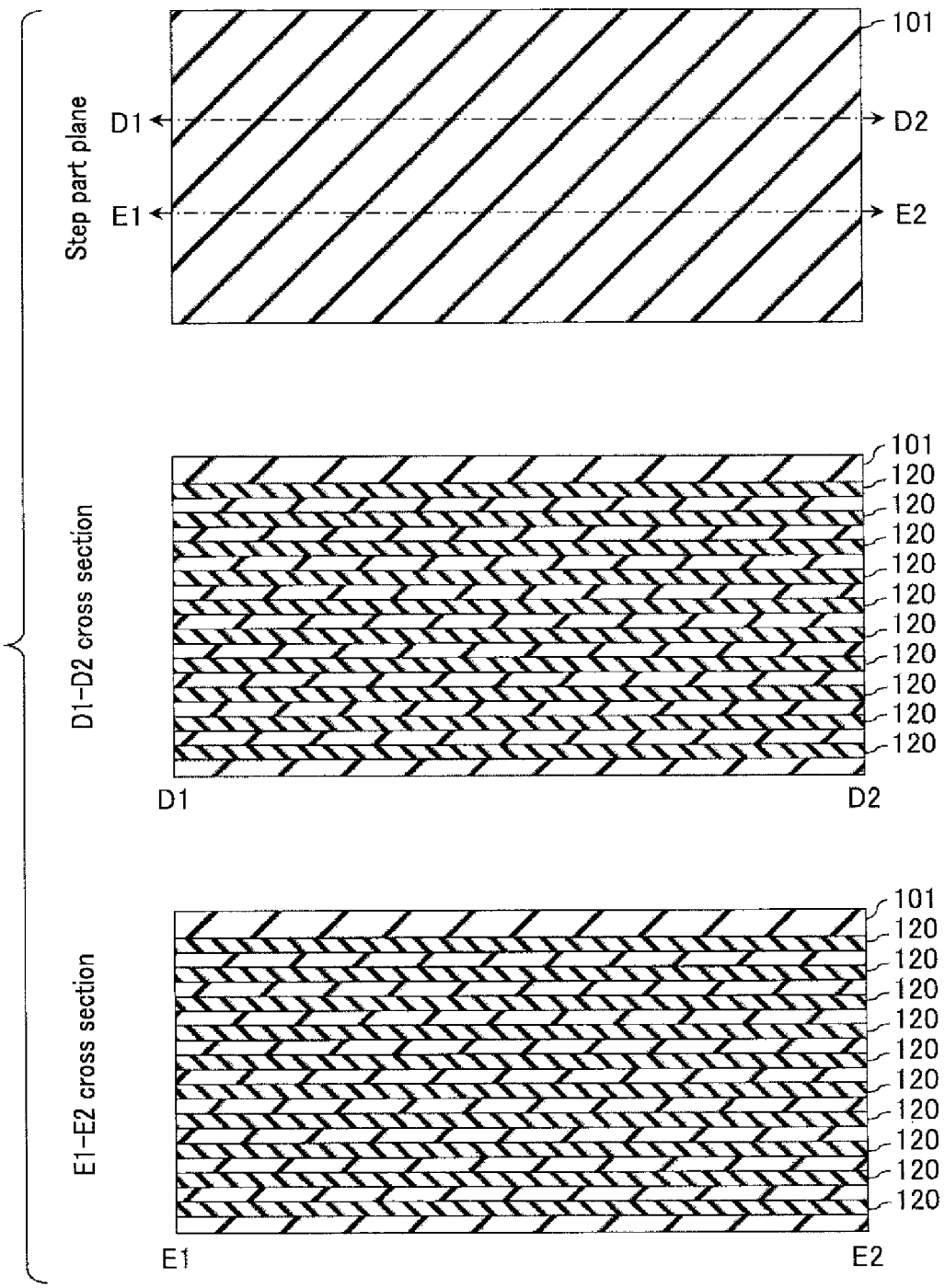

As shown in FIG. 21, ten sacrifice layers 120 corresponding to the interconnect layers 103 are stacked on the interconnect layer 102 (not depicted in the drawings) with the insulating layers 101 interposed therebetween, and the insulating layer 101 is additionally formed on the uppermost sacrifice layer 120.

Figure 22:
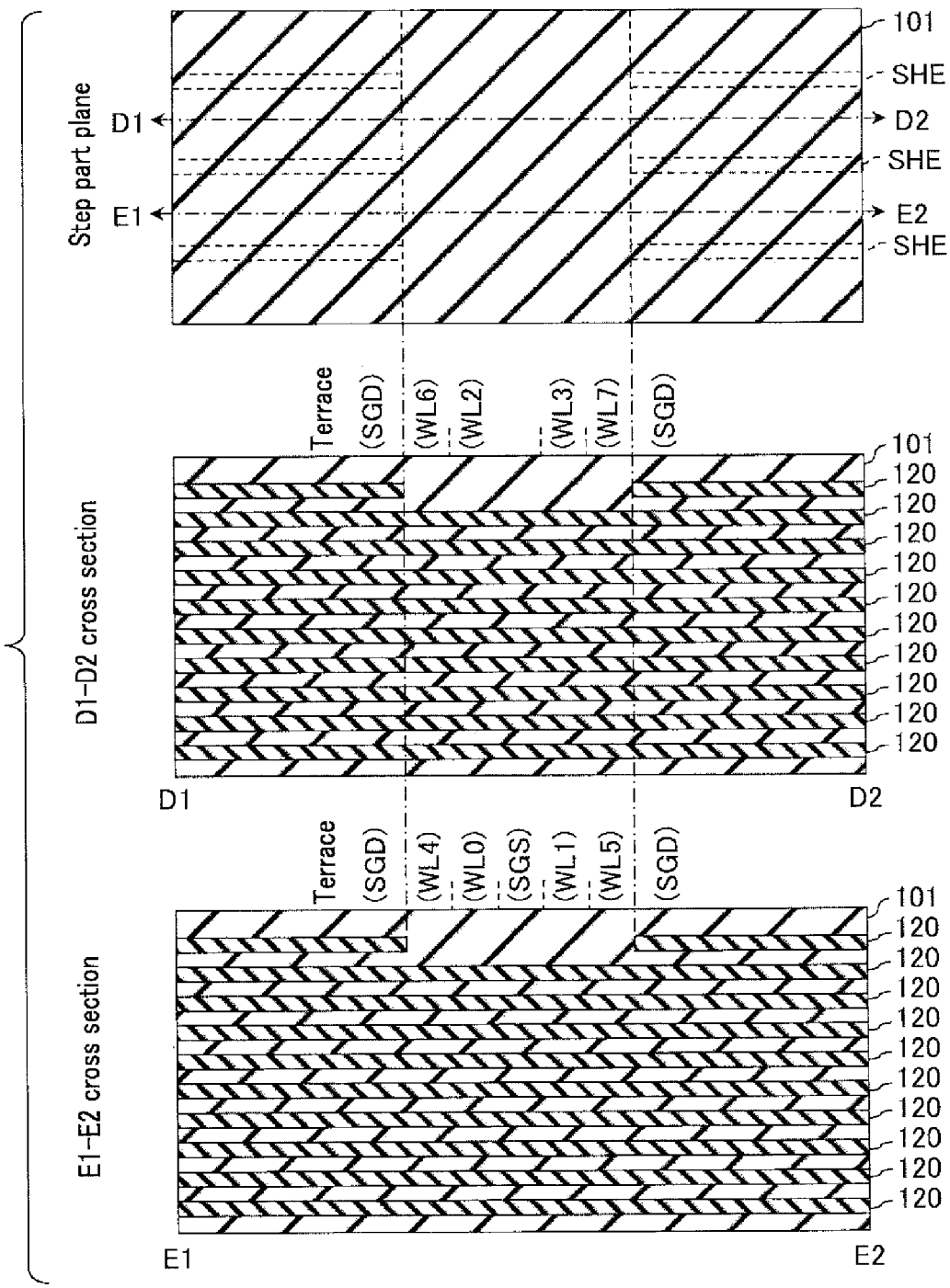

As shown in FIG. 22, next, in the terraces of the word lines WL0 to WL7 and the select gate line SGS, and regions corresponding to the slits SHE between the string units SU, the uppermost sacrifice layer 120 is processed. In the present embodiment, the uppermost sacrifice layer 120 corresponding to the select gate lines SGD0 to SGD3 is separated by the slits SHE. Then, portions where the sacrifice layers 120 are removed are filled with the insulating layers 101. Thus, in part of the regions depicted in the D1-D2 cross section and the E1-E2 cross section, the uppermost sacrifice layer 120 is removed. Thereafter, for example, the memory pillars MP and the dummy pillars HR are formed.

Figure 23:
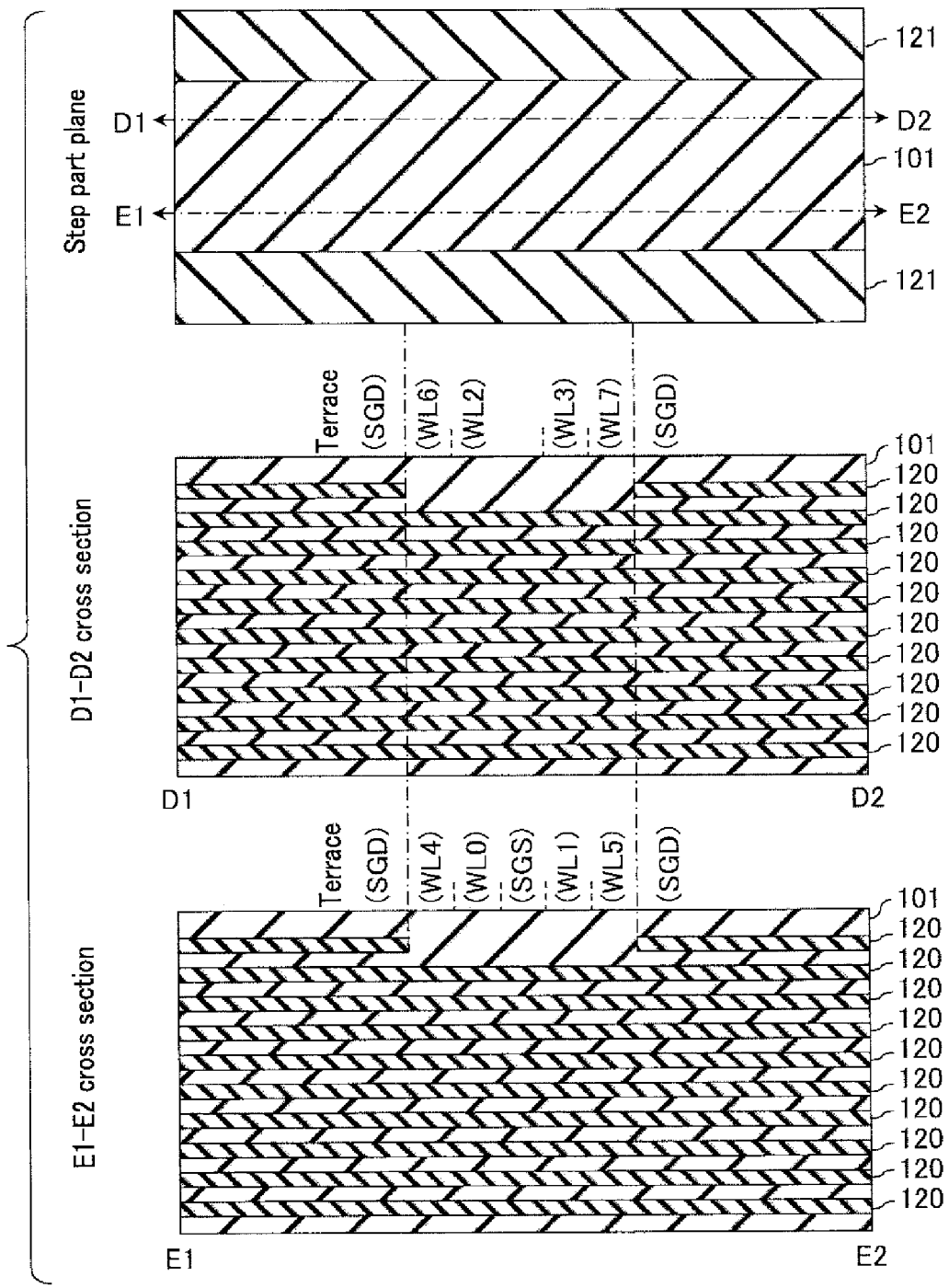

As shown in FIG. 23, next, the protection layers 121 are formed in the step parts of the string units SU0 and SU3.

Figure 24:
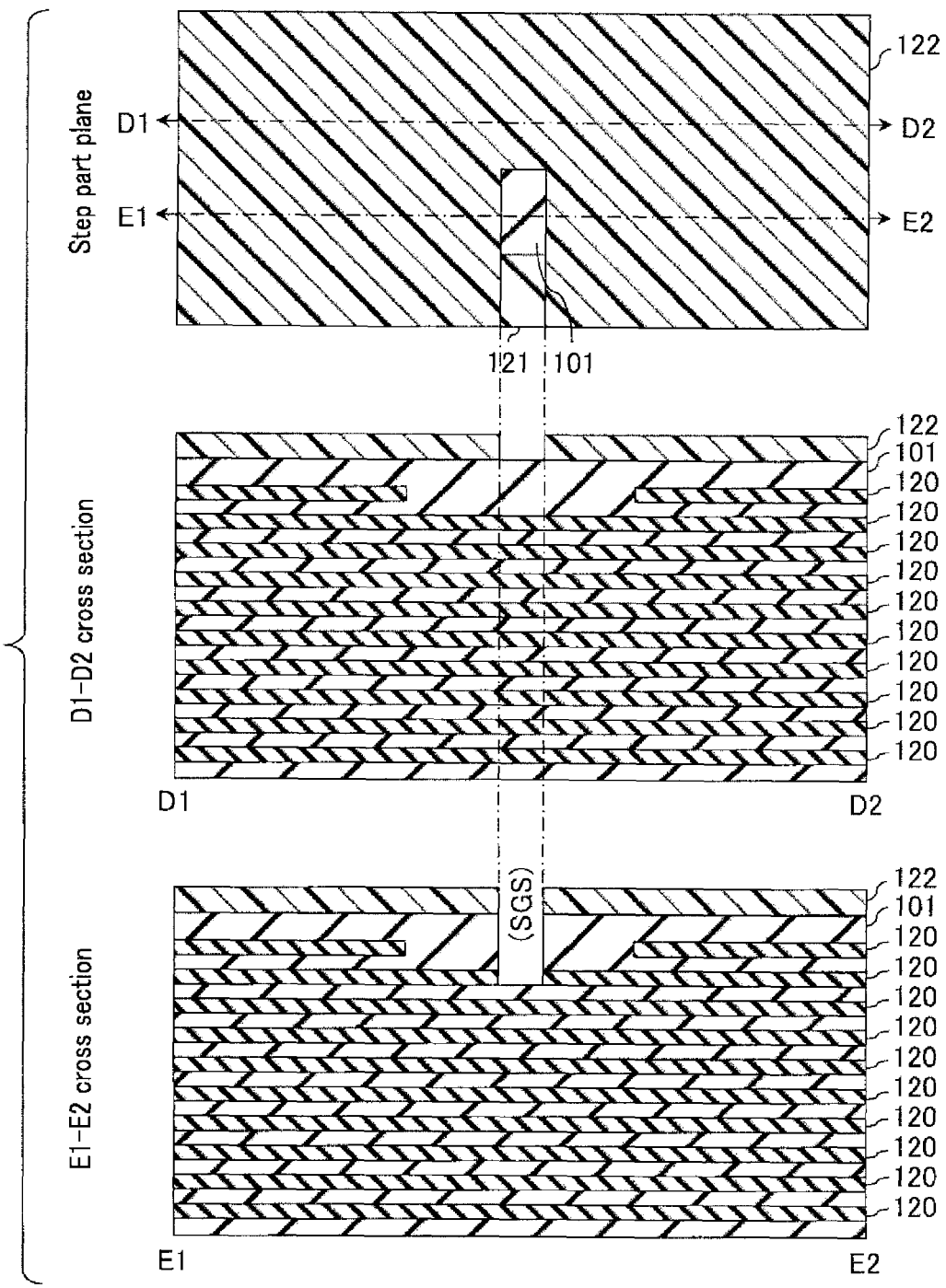

As shown in FIG. 24, next, a resist pattern 122 is formed for processing the terrace region of the select gate line SGS. Then, the insulating layers 101 and the sacrifice layers 120 are processed one layer each. Thus, in the terrace region of the select gate line SGS depicted in the E1-E2 cross section, the two uppermost sacrifice layers 120 are removed. In addition, in the terrace regions of the word lines WL0 to WL7, the uppermost sacrifice layer 120 is removed.

Figure 25:
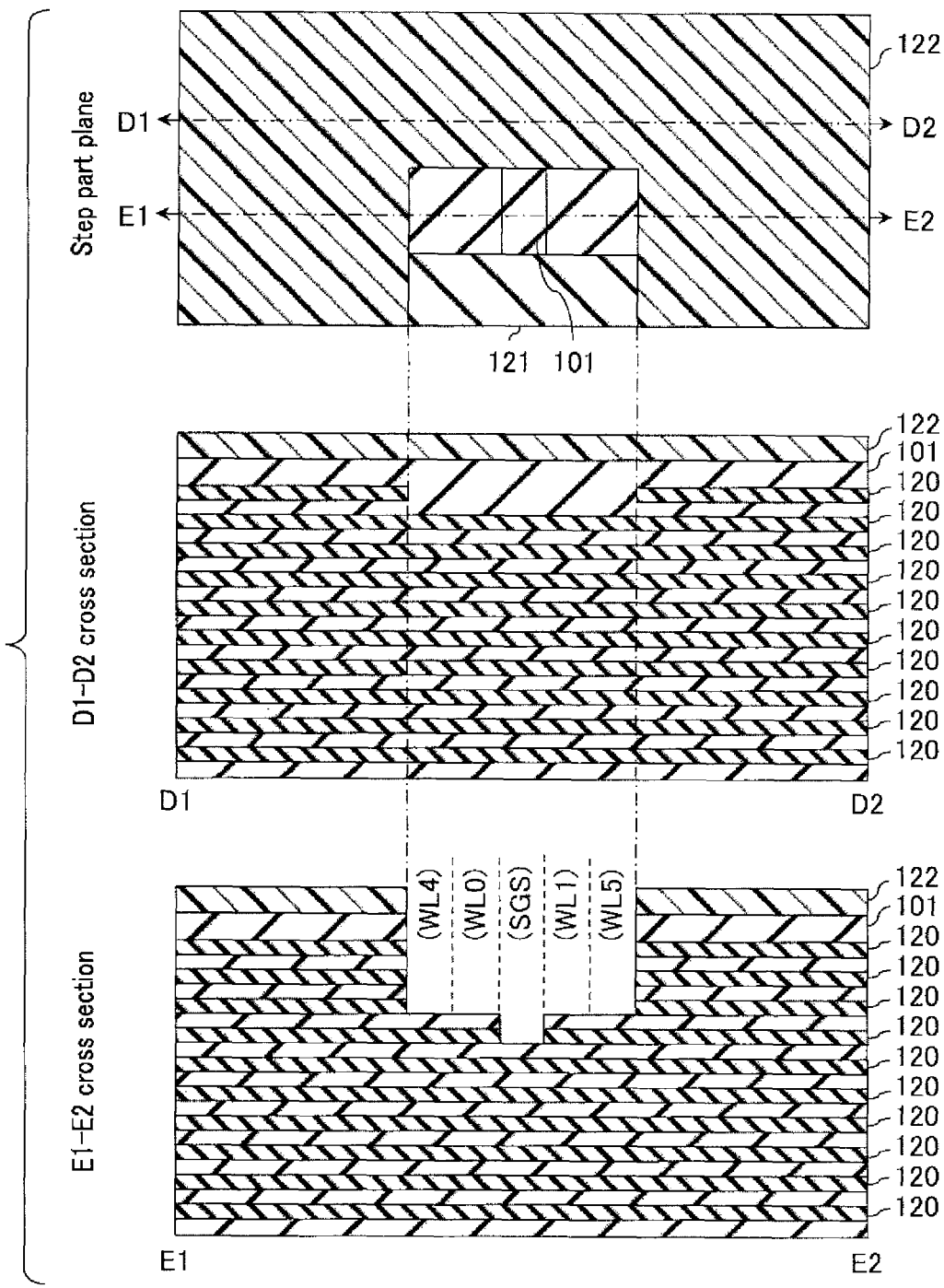

As shown in FIG. 25, next, a resist pattern 122 is formed for processing the terrace regions of the word lines WL4 and WL0, the select gate line SGS, and the word lines WL1 and WL5. Then, the insulating layers 101 and the sacrifice layers 120 are processed two layers each. Thus, in the terrace regions of the word lines WL4, WL0, WL1, and WL5 depicted in the E1-E2 cross section, the three uppermost sacrifice layers 120 are removed, and in the terrace region of the select gate line SGS, the four uppermost sacrifice layers 120 are removed. In addition, in the terrace regions of the word lines WL6, WL2, WL3, and WL7 depicted in the D1-D2 cross section, the uppermost sacrifice layer 120 is removed.

Figure 26:
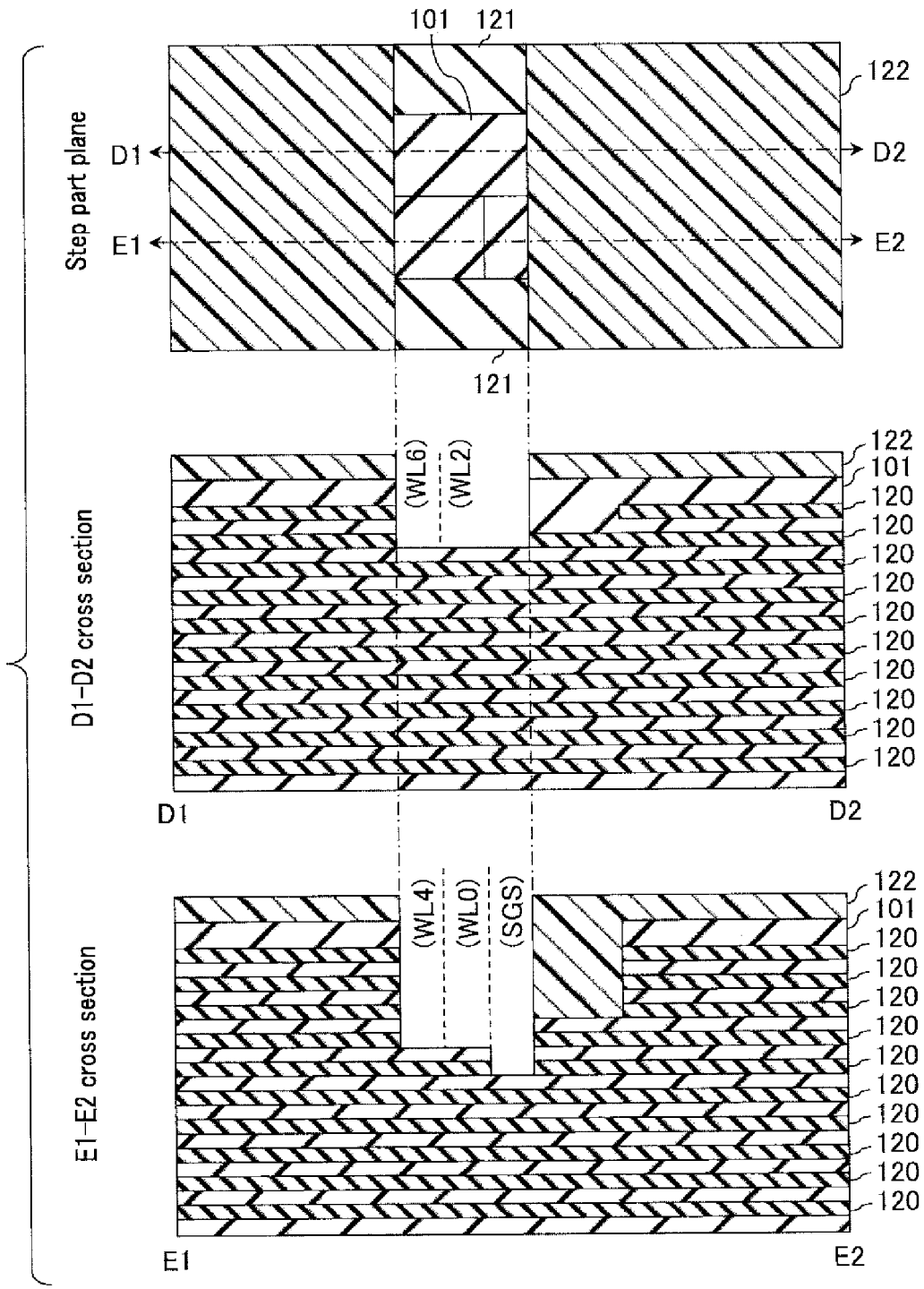

As shown in FIG. 26, next, a resist pattern 122 is formed for processing the terrace regions of the word lines WL6, WL4, WL2, and WL0, and the select gate line SGS. Then, the insulating layers 101 and the sacrifice layers 120 are processed one layer each. Thus, in the terrace regions of the word lines WL6 and WL2 depicted in the D1-D2 cross section, the two uppermost sacrifice layers 120 are removed. In addition, in the regions of the word lines WL3 and WL7, the uppermost sacrifice layer 120 is removed. In the terrace regions of the word lines WL4 and WL0 depicted in the E1-E2 cross section, the four uppermost sacrifice layers 120 are removed, and in the terrace region of the select gate line SGS, the five uppermost sacrifice layers 120 are removed. In addition, in the terrace regions of the word lines WL1 and WL5, the three uppermost sacrifice layers 120 are removed.

Figure 27:
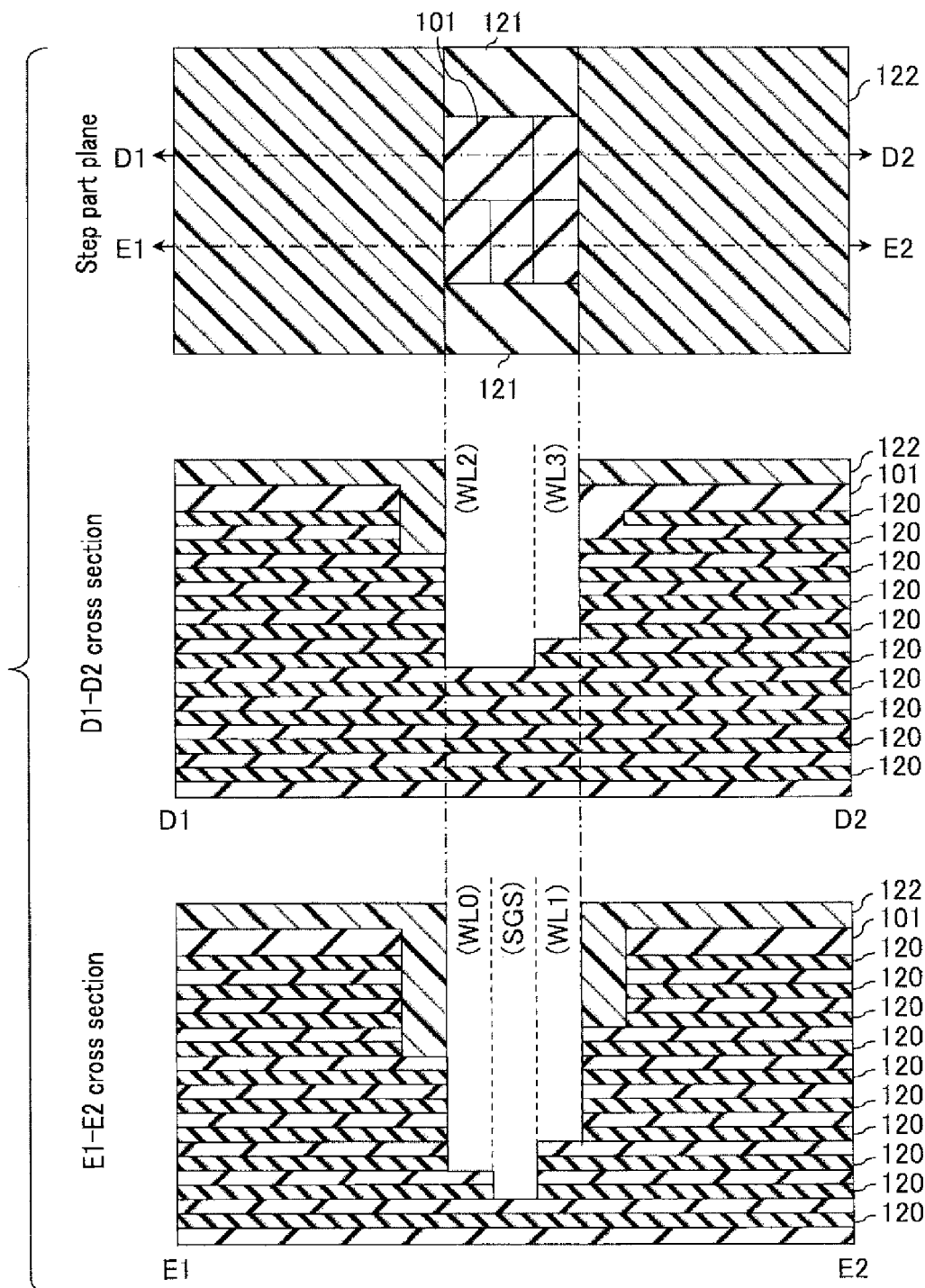

As shown in FIG. 27, next, a resist pattern 122 is formed for processing the terrace regions of the word lines WL0 to WL3 and the select gate line SGS. Then, the insulating layers 101 and the sacrifice layers 120 are processed four layers each. Thus, in the terrace region of the word line WL2 depicted in the D1-D2 cross section, the six uppermost sacrifice layers 120 are removed, and in the terrace region of the word line WL3, the five uppermost sacrifice layers 120 are removed. In addition, in the terrace region of the word line WL6, the two uppermost sacrifice layers 120 are removed, and in the terrace region of the word line WL7, the uppermost sacrifice layer 120 is removed. In the terrace region of the word line WL0 depicted in the E1-E2 cross section, the eight uppermost sacrifice layers 120 are removed, in the terrace region of the select gate line SGS, the nine uppermost sacrifice layers 120 are removed, and in the terrace region of the word line WL1, the seven uppermost sacrifice layers 120 are removed. In addition, in the terrace region of the word line WL4, the four uppermost sacrifice layers 120 are removed, and in the terrace region of the word line WL5, the three uppermost sacrifice layers 120 are removed.

Figure 28:
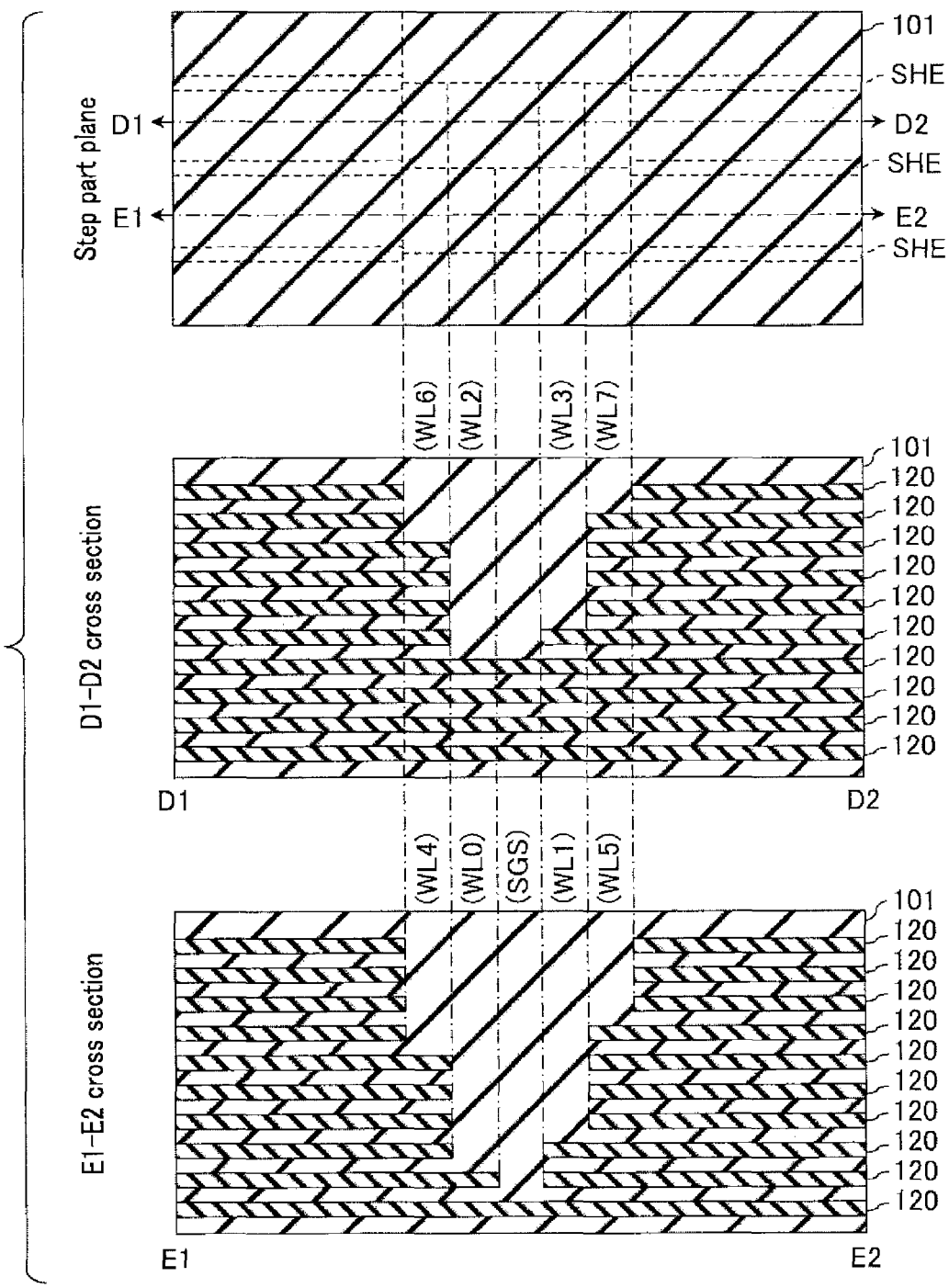

As shown in FIG. 28, next, after removing the resist pattern 122 and the protection layer 121, the terrace regions of the word lines WL0 to WL7 and the select gate line SGS are filled by the insulating layers 101, and the surface of the insulating layers 101 is planarized by, for example, CMP, etc.

Figure 29:
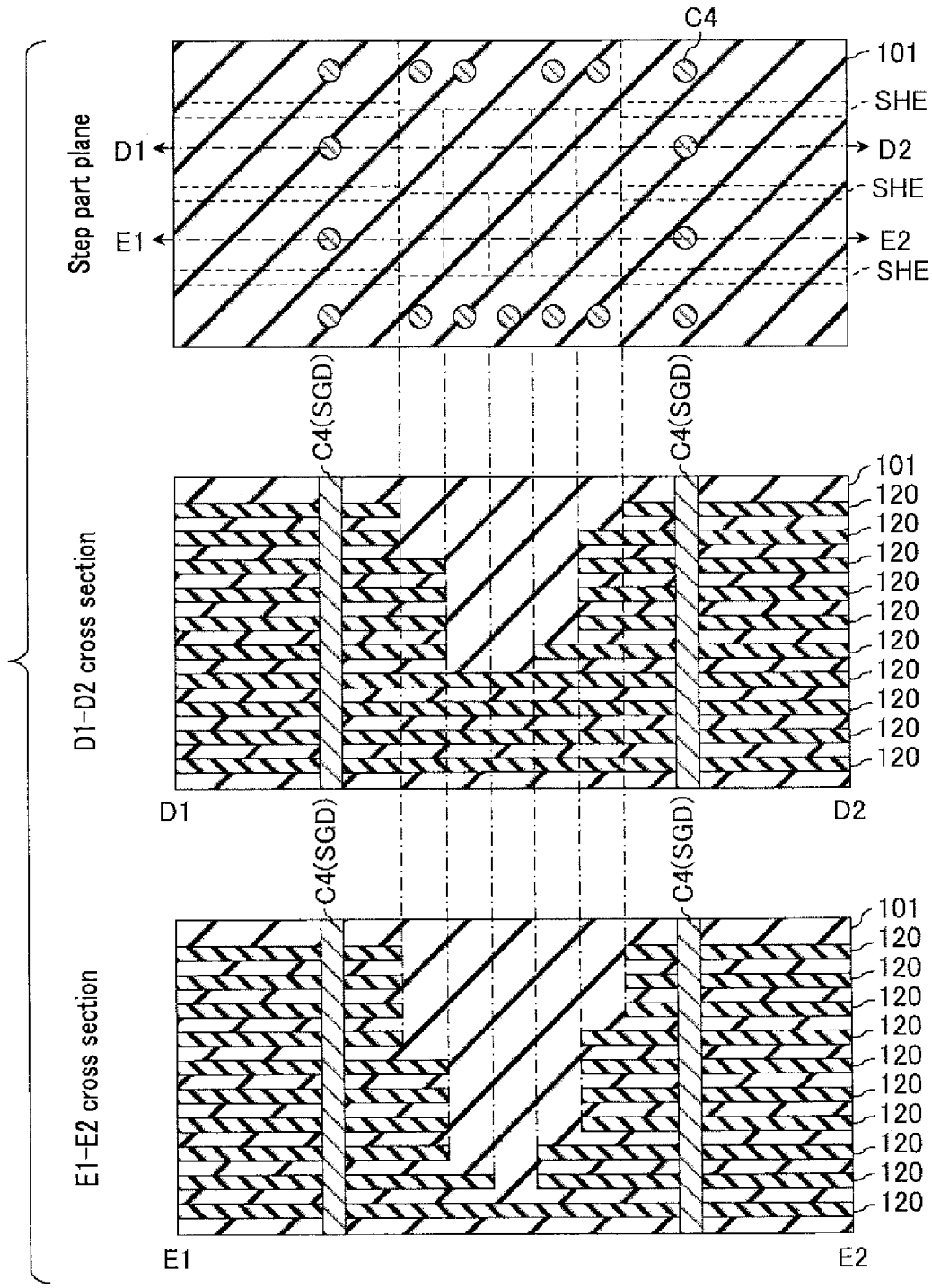

As shown in FIG. 29, next, contact plugs C4 corresponding to the word lines WL0 to WL7 and the select gate lines SGD and SGS are formed.

As shown in FIG. 30, first, the slit SLT is processed to form a groove pattern. Next, the sacrifice layers 120 are backfilled with W and TiN. Then, after removing the TiN and W formed on the side surfaces and bottom portion of the slit and insulating layers 101 to form the interconnect layers 103, the groove pattern of the slit SLT is filled with $SiO_2$.

Figure 31:
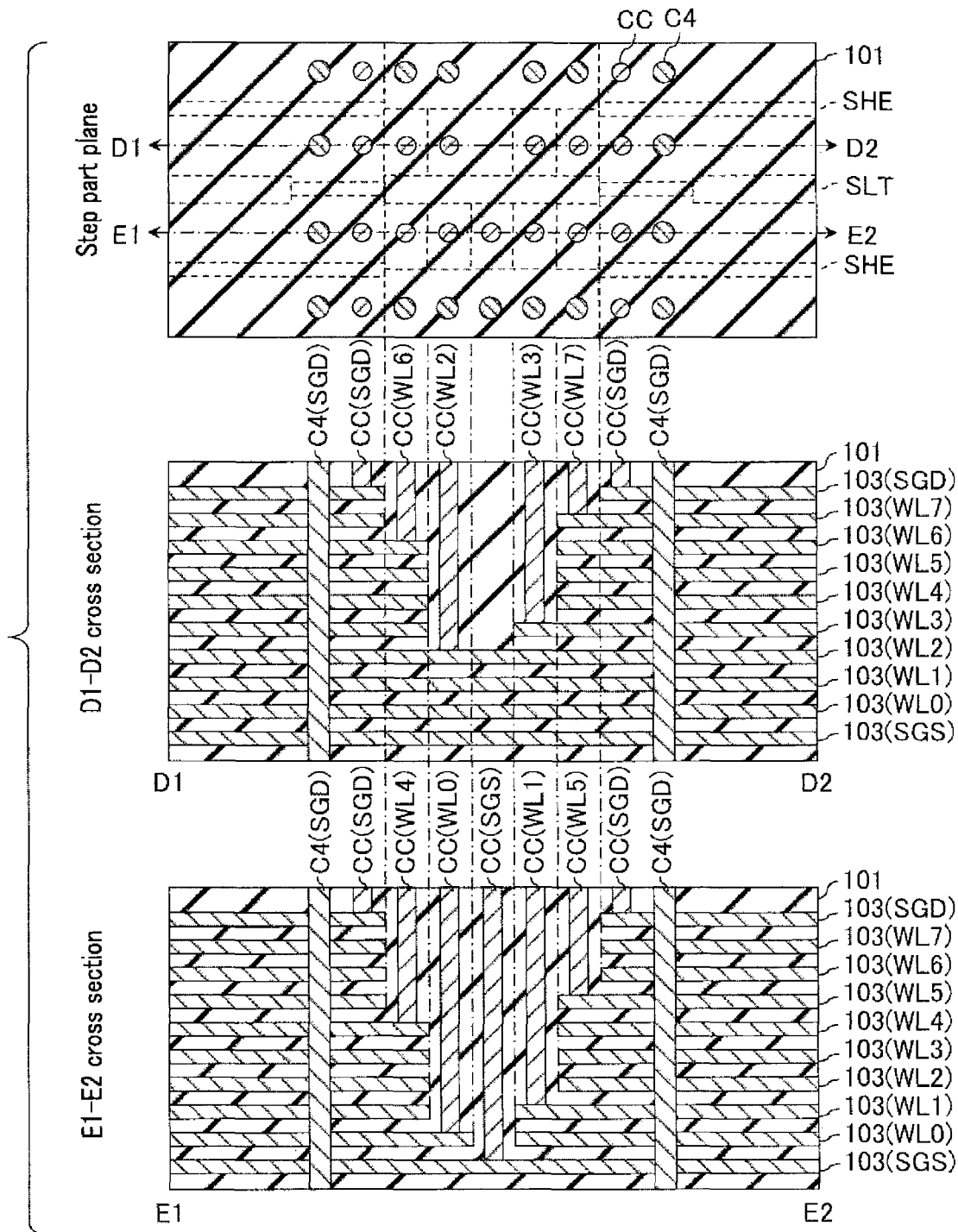

As shown in FIG. 31, next, the contact plugs CC corresponding to the word lines WL0 to WL7 and the select gate lines SGD and SGS are formed.

2.3 Advantageous Effect According to the Present Embodiment

The configuration of the present embodiment achieves an advantageous effect similar to that achieved by the first embodiment.

In addition, in the configuration according to the present embodiment, since the terraces of the stacked word lines WL0 to WL7 are arranged in two parallel rows along the first direction D1, the length of the step part in the first direction D1 can be shortened. Accordingly, the increase in a chip area can be suppressed.

3. Modifications Etc.

The semiconductor memory device according to the above-described embodiments includes a plurality of first interconnect layers (103) stacked above a semiconductor substrate with first insulating layers interposed therebetween, first and second memory pillars (MP) penetrating the plurality of first interconnect layers, and a plurality of first plugs (CC), bottom surfaces of which are respectively in contact with the plurality of first interconnect layers. The plurality of first interconnect layers include a first array region where the first memory pillar penetrates the plurality of first interconnect layers, a second array region where the second memory pillar penetrates the plurality of first interconnect layers, and a coupling region (a step part) where a plurality of coupling parts (terraces) respectively coupled to the plurality of first plugs are formed. Along a first direction parallel to the semiconductor substrate, the first array region, the coupling region, and the second array region are arranged in order.

By applying the above-described embodiments, a semiconductor memory device allowing for improved processing capabilities can be provided. It should be noted that the embodiments are not limited to the aspects described above, but can be modified in various ways.

For example, the semiconductor memory device according to the above-described embodiments is not limited to a three-dimensional stacked NAND flash memory. The device can be applied to a three-dimensional stacked memory, such as ReRAM etc. in which word lines are stacked.

Furthermore, the term "couple" in the above-described embodiments also includes a state of indirect coupling between objects via another object, for example, a transistor, a resistor or etc.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first conductive layers stacked in a first direction and disposed between nearest of two first slits in a second direction;
a second conductive layer disposed above the plurality of first conductive layers and disposed between one of the nearest two first slits and a second slit;
a third conductive layer disposed above the plurality of first conductive layers and disposed between another of the nearest two first slits and the second slit;
a first pillar extending through the plurality of first conductive layers and the second conductive layer in the first direction, the first pillar including a semiconductor layer;
a second pillar extending through the plurality of first conductive layers and the third conductive layer in the first direction, the second pillar including a semiconductor layer;
a first plug extending in the first direction and in contact with the second conductive layer;
a second plug extending in the first direction and in contact with the third conductive layer;
a third plug extending through the plurality of first conductive layers and the second conductive layer in the first direction and electrically connected to the first plug; and
a fourth plug extending through the plurality of first conductive layers and the third conductive layer in the first direction and electrically connected to the second plug.

2. The device according to claim 1, further comprising:
a first insulating layer provided between the third plug and the plurality of first conductive layers; and
a second insulating layer provided between the fourth plug and the plurality of first conductive layers,
wherein the third plug and the fourth plug are not in contact with the plurality of first conductive layers.

3. The device according to claim 1, further comprising:
a fifth plug extending in the first direction and in contact with a first layer among the plurality of first conductive layers; and
a sixth plug extending in the first direction and in contact with a second layer among the plurality of first conductive layers,
wherein the first layer and the second layer are arranged stepwise along a third direction crossing the first direction and the second direction.

4. The device according to claim 3, wherein the first layer and the second layer are arranged in a two-stage stepwise shape.

5. The device according to claim 1, wherein the first and second pillars each include a third insulating layer, a charge storage layer, and a fourth insulating layer, which are provided in order on a side surface of the semiconductor layer.

6. The device according to claim 1, further comprising a circuit provided below the plurality of first conductive layers and to which bottom surfaces of the third and fourth plugs are electrically coupled.

7. The device according to claim 6, wherein the circuit is a row decoder.

8. The device according to claim 1, further comprising a fourth conductive layer provided above the first and second pillars and electrically coupled to the semiconductor layer of the first pillar and the semiconductor layer of the second pillar.

9. The device according to claim 8, further comprising a sense amplifier to which the fourth conductive layer is electrically coupled.

10. The device according to claim 1, further comprising a fifth conductive layer provided below the plurality of first conductive layers and contacting bottom surfaces of the first and second pillars.

11. The device according to claim 1, wherein end portions of the plurality of first conductive layers are arranged stepwise along a third direction crossing the first direction and the second direction.

12. The device according to claim 1, further comprising:
a sixth conductive layer disposed above the plurality of first conductive layers and disposed in a third direction crossing the first direction and the second direction of the second conductive layer;
a seventh conductive layer disposed above the plurality of first conductive layers, disposed in the third direction of the third conductive layer, and disposed in the second direction of the sixth conductive layer;
a third pillar extending through the plurality of first conductive layers and the sixth conductive layer, the third pillar including a semiconductor layer; and
a fourth pillar extending through the plurality of first conductive layers and the seventh conductive layer, the fourth pillar including a semiconductor layer,
wherein the first and third plugs are disposed between the first pillar and the third pillar, and
the second and fourth plugs are disposed between the second pillar and the fourth pillar.

* * * * *